(12) United States Patent
Yanagihara

(10) Patent No.: US 12,706,572 B2
(45) Date of Patent: Aug. 11, 2026

(54) POWER AMPLIFIER

(71) Applicant: Murata Manufacturing Co., Ltd., Kyoto (JP)

(72) Inventor: Shingo Yanagihara, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 473 days.

(21) Appl. No.: 18/361,222

(22) Filed: Jul. 28, 2023

(65) Prior Publication Data

US 2024/0039484 A1 Feb. 1, 2024

(30) Foreign Application Priority Data

Jul. 28, 2022 (JP) ................................ 2022-120804

(51) Int. Cl.
*H03F 1/52* (2006.01)
*H03F 3/21* (2006.01)

(52) U.S. Cl.
CPC ............... *H03F 1/52* (2013.01); *H03F 3/211* (2013.01); *H03F 2200/451* (2013.01)

(58) Field of Classification Search
None
See application file for complete search history.

(56) References Cited

U.S. PATENT DOCUMENTS 7,355,480 B2 * 4/2008 Honda ...................... H03F 1/30 330/296
2021/0305951 A1 * 9/2021 Tsutsui .................... H03F 3/245
2022/0321065 A1 * 10/2022 Costantini ............... H03F 3/195

FOREIGN PATENT DOCUMENTS

JP 2008-004987 A 1/2008

* cited by examiner

*Primary Examiner* — Andrea Lindgren Baltzell
*Assistant Examiner* — Malane Lieng
(74) *Attorney, Agent, or Firm* — McDonald Hopkins LLC

(57) ABSTRACT

A power amplifier includes an amplifier circuit configured to amplify a radio frequency input signal, a bias circuit configured to output a bias current to the amplifier circuit, and a bias suppression circuit configured to suppress the bias current based on the radio frequency input signal. The bias circuit includes a first transistor including a collector and a base that are electrically connected to a first node to be input with a current and an emitter electrically connected to a second node, a second transistor including a collector and a base that are electrically connected to the second node, and a third transistor including a base electrically connected to the first node and an emitter, the third transistor being configured to output a bias current from the emitter. The bias suppression circuit draws a current from the second node of the bias circuit based on the radio frequency input signal.

5 Claims, 10 Drawing Sheets

1A
10A
11A
13
12
12a
12b
12c
20A
21
22
23
24
CL1
CL2
CL4
CL5
Pin
RFin
Pin_rep
Pout
RFout
VCC1
VCC2
T1
T2
RF1
Q1
Q2
Q51
Q52
R1
R2
R3
R4
R5
R51
R52
R53
R54
R55
C1
C2
C51
C52
T21
Vbatt
BIAS1
BIAS2
BIAS3
BIAS4
Q11
Q12
Q13
C11
R11
N11
N12
Vsink1
Q61
Q62
Q63
C61
R61
N61
N62
Vsink2
Q71
Q72
Q73
C71
R71
N71
N72
Q81
Q82
Q83
C81
R81
N81
N82
T11
T12
T13
T14
IB1
IB2
IB3
IB4

POWER AMPLIFIER

CROSS REFERENCE TO RELATED APPLICATION

This application claims priority from Japanese Patent Application No. 2022-120804 filed on Jul. 28, 2022. The content of this application is incorporated herein by reference in its entirety.

BACKGROUND OF THE DISCLOSURE

1. Field of the Disclosure

The present disclosure relates to a power amplifier.

2. Description of the Related Art

Japanese Unexamined Patent Application Publication No. 2008-4987 describes a transmitter in which a mixer, a drive amplifier, and a power amplifier are connected in series. The power amplifier includes an output transistor and a reference transistor. When a large current flows between a collector and an emitter of the output transistor due to a change in load, the reference transistor draws a current from between a current source and a bias circuit. Thus, the power amplifier can protect the output transistor from an overcurrent.

However, the power amplifier described in Japanese Unexamined Patent Application Publication No. 2008-4987 does not consider protection when a radio frequency input signal is excessively inputted. Further, in the power amplifier described in Japanese Unexamined Patent Application Publication No. 2008-4987, since a current is drawn from between the current source and the bias circuit when a load changes, fine adjustment of the bias current cannot be performed. Thus, in the power amplifier described in Japanese Unexamined Patent Application Publication No. 2008-4987, when the load returns to the original state, it takes time for the bias circuit to return to the original state, and it takes time for its amplifying operation to return to the original state.

BRIEF SUMMARY OF THE DISCLOSURE

The present disclosure has been made in view of the above, and a possible benefit of the present disclosure is to suppress damage when a radio frequency input signal becomes large.

A power amplifier according to one aspect of the present disclosure includes an amplifier circuit including an amplifier transistor including a base electrically connected to an input terminal, the amplifier transistor being configured to amplify a radio frequency input signal to be inputted to the input terminal, a bias circuit electrically connected to the base of the amplifier transistor, the bias circuit being configured to output a bias current to the base of the amplifier transistor, and a bias suppression circuit electrically connected to the input terminal, the bias suppression circuit being configured to suppress the bias current based on the radio frequency input signal. The bias circuit includes a first transistor including a collector and a base that are electrically connected to a first node to be input with a current and an emitter electrically connected to a second node, a second transistor including a collector and a base that are electrically connected to the second node, and a third transistor including a base electrically connected to the first node and an emitter, the third transistor being configured to output a bias current from the emitter. The bias suppression circuit is electrically connected to the second node, and draws a current from the second node of the bias circuit based on the radio frequency input signal.

According to the present disclosure, it is possible to suppress damage when a radio frequency input signal becomes large.

DETAILED DESCRIPTION OF THE DISCLOSURE

Hereinafter, embodiments of the present disclosure will be described in detail with reference to the drawings. It should be noted that the present disclosure is not limited to the embodiments. Each embodiment is an example, and it is needless to say that partial replacement or combination of configurations illustrated in different embodiments is possible.

First Embodiment

Figure 1:
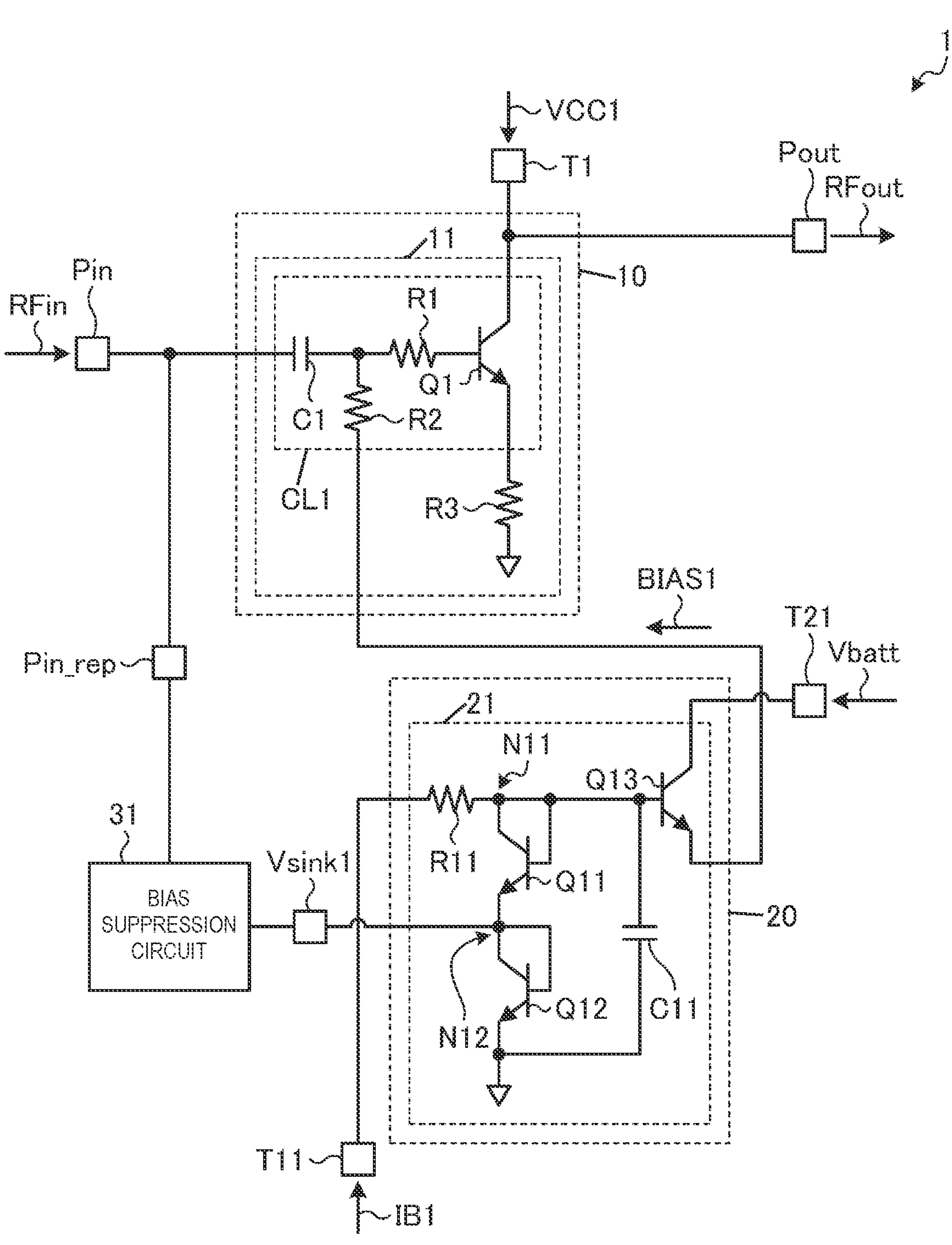
FIG. 1 is a diagram illustrating a configuration of a power amplifier according to a first embodiment.

FIG. 1 is a diagram illustrating a configuration of a power amplifier according to a first embodiment. The power amplifier 1 amplifies a radio frequency input signal RFin and outputs a radio frequency output signal RFout.

The power amplifier 1 includes an amplifier circuit 10, a bias circuit 20, and a bias suppression circuit 31. The amplifier circuit 10 includes a first circuit 11. The bias circuit 20 includes a first bias circuit 21.

The amplifier circuit 10 is a single-stage amplifier circuit including the first circuit 11.

The first circuit 11 includes a capacitor C1, resistors R1 and R2, a transistor Q1, and a resistor R3.

The transistor Q1 corresponds to an example of an "amplifier transistor" of the present disclosure.

In the present disclosure, each transistor is a bipolar transistor, but the present disclosure is not limited thereto. As the bipolar transistor, a heterojunction bipolar transistor (HBT) is exemplified, but the present disclosure is not limited thereto. The transistor may be, for example, a field effect transistor (FET). The transistor may be a multi-finger transistor in which a plurality of unit transistors is electrically connected in parallel. The unit transistor refers to a minimum configuration in which a transistor is configured.

The capacitor C1, the resistors R1 and R2, and the transistor Q1 may be formed as one cell CL1 on a semiconductor chip.

The radio frequency input signal RFin is inputted to one end of the capacitor C1 through a terminal Pin. The capacitor C1 is a DC-cut capacitor that cuts the direct-current components of the radio frequency input signal RFin.

One end of the resistor R1 is electrically connected to the other end of the capacitor C1. The other end of the resistor R1 is electrically connected to a base of the transistor Q1.

A bias current BIAS1 is inputted to one end of the resistor R2 from the first bias circuit 21. The other end of the resistor R2 is electrically connected to the one end of the resistor R1.

An emitter of the transistor Q1 is electrically connected to a reference potential through the resistor R3. As the reference potential, a ground potential is exemplified, but the present disclosure is not limited thereto.

The bias current BIAS1 is inputted to the base of the transistor Q1 through the resistor R2 and the resistor R1. Also, the radio frequency input signal RFin is inputted to the base of the transistor Q1 through the capacitor C1 and the resistor R1.

A power supply voltage VCC1 is inputted to a collector of the transistor Q1 through a terminal T1.

The transistor Q1 amplifies the radio frequency input signal RFin and outputs a radio frequency output signal RFout from the collector thereof to a terminal Pout.

A bias current IB1 is inputted to the first bias circuit 21 from the outside through a terminal T11. The first bias circuit 21 outputs the bias current BIAS1 to the first circuit 11 based on the bias current IB1.

The first bias circuit 21 includes a resistor R11, transistors Q11, Q12, and Q13, and a capacitor C11.

The transistor Q11 corresponds to an example of a “first transistor” of the present disclosure. The transistor Q12 corresponds to an example of a “second transistor” of the present disclosure. The transistor Q13 corresponds to an example of a “third transistor” of the present disclosure.

The bias current IB1 is inputted to one end of the resistor R11 through the terminal T11. The other end of the resistor R11 is electrically connected to a node N11.

The node N11 corresponds to an example of a “first node” of the present disclosure.

A collector and a base of the transistor Q11 are electrically connected to the node N11. That is, the transistor Q11 is diode-connected. An emitter of the transistor Q11 is electrically connected to a node N12.

The node N12 corresponds to an example of a “second node” of the present disclosure.

A collector and a base of the transistor Q12 are electrically connected to the node N12. That is, the transistor Q12 is diode-connected. An emitter of the transistor Q12 is electrically connected to the reference potential.

The transistors Q11 and Q12 generate a certain voltage. The voltage generated by the transistors Q11 and Q12 is a voltage of the node N11.

One end of the capacitor C11 is electrically connected to the node N11. The other end of the capacitor C11 is electrically connected to the reference potential. The capacitor C11 stabilizes the voltage of the node N11.

A power supply voltage Vbatt is inputted to a collector of the transistor Q13 through a terminal T21. A base of the transistor Q13 is electrically connected to the node N11. An emitter of the transistor Q13 is electrically connected to the one end of the resistor R2. That is, the transistor Q13 and the resistor R2 are emitter-follower connected.

The transistor Q13 outputs the bias current BIAS1 corresponding to the voltage of the node N11 from the emitter thereof to the one end of the resistor R2.

Note that the circuit configuration of the first bias circuit 21 is an example, and the present disclosure is not limited thereto. For example, the first bias circuit 21 may include a push-pull circuit that performs a push-pull operation on the emitter of the transistor Q13.

The bias suppression circuit 31 suppresses the bias current BIAS1 based on a magnitude of the radio frequency input signal RFin.

The radio frequency input signal RFin is inputted to the bias suppression circuit 31 through a connection point Pin_rep. Note that the connection point Pin_rep is provided for convenience of description, and does not need to be provided in an actual circuit (or may be a simple wiring).

The bias suppression circuit 31 is electrically connected to the node N12 through a connection point Vsink1. Note that the connection point Vsink1 is provided for convenience of description, and does not need to be provided in an actual circuit (or may be a simple wiring).

The bias suppression circuit 31 draws a current from the node N12 based on the radio frequency input signal RFin. This decreases the voltage of the node N11, that is, a base voltage of the transistor Q13. In addition, a base current flowing from the node N11 to the transistor Q13 decreases. Thus, the bias suppression circuit 31 can suppress the bias current BIAS1 outputted from the emitter of the transistor Q13.

Figure 2:
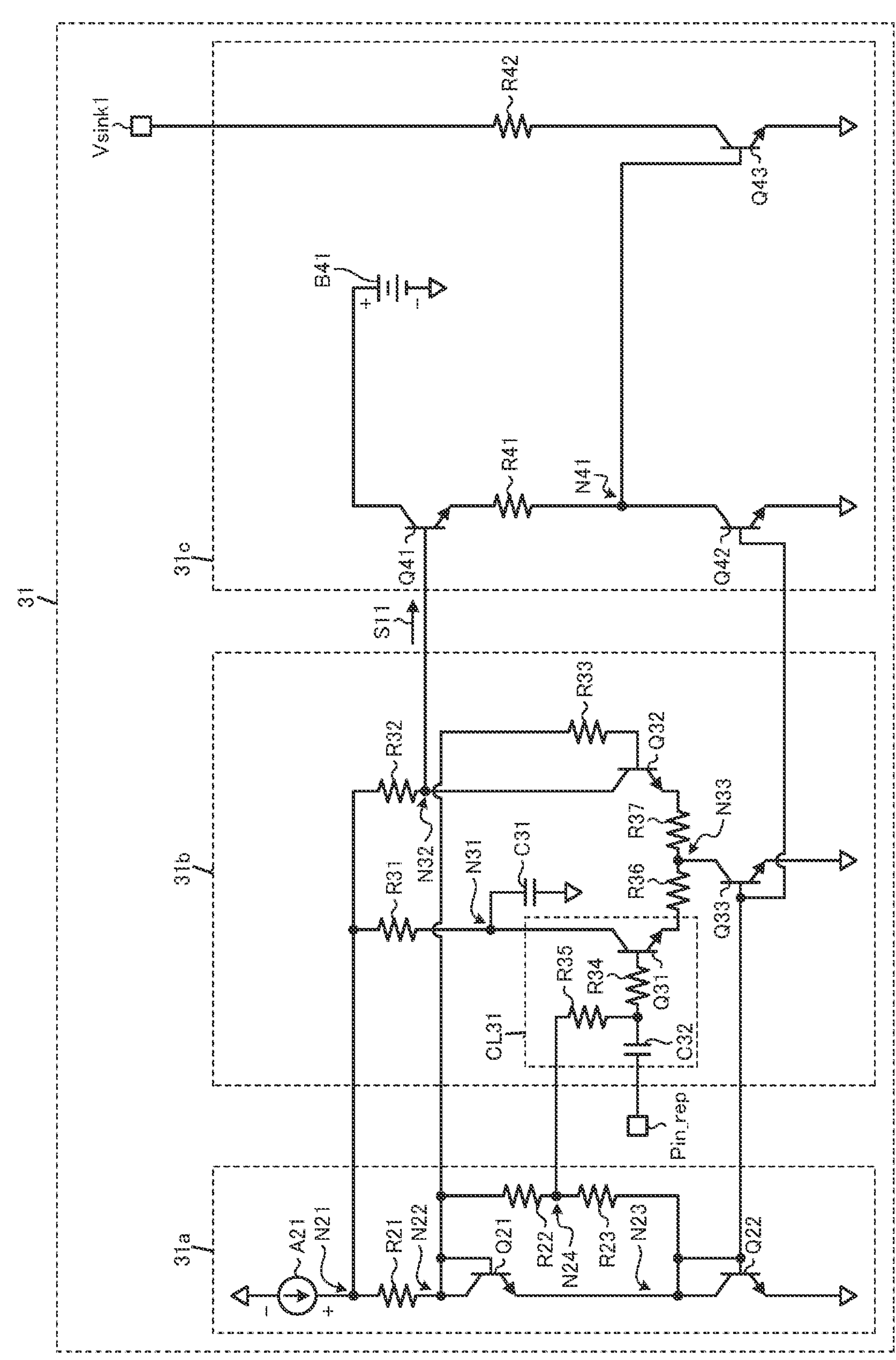
FIG. 2 is a diagram illustrating a configuration of a bias suppression circuit of the power amplifier according to the first embodiment.

FIG. 2 is a diagram illustrating a configuration of the bias suppression circuit of the power amplifier according to the first embodiment.

The bias suppression circuit 31 includes a setting circuit 31*a*, a differential inverting circuit 31*b*, and a current drawing circuit 31*c*.

The setting circuit 31*a* sets the operating points (biases) of the differential inverting circuit 31*b* and the current drawing circuit 31*c*.

The differential inverting circuit 31*b* outputs a signal S11 to the current drawing circuit 31*c* based on the radio frequency input signal RFin inputted from the connection point Pin_rep.

The current drawing circuit 31*c* draws a current from the connection point Vsink1 (that is, the node N12 (see FIG. 1)) based on the signal S11.

The setting circuit 31*a* includes a constant current source A21, resistors R21, R22, and R23, and transistors Q21 and Q22.

The constant current source A21 outputs a constant current to a node N21. One end of the resistor R21 is electrically connected to the node N21. The other end of the resistor R21 is electrically connected to a node N22.

A collector and a base of the transistor Q21 are electrically connected to the node N22. That is, the transistor Q21 is diode-connected. An emitter of the transistor Q21 is electrically connected to a node N23.

A collector and a base of the transistor Q22 are electrically connected to the node N23. That is, the transistor Q22 is diode-connected. An emitter of the transistor Q22 is electrically connected to the reference potential.

The transistors Q21 and Q22 generate a certain voltage. The voltage generated by the transistors Q21 and Q22 is a voltage of the node N22.

One end of the resistor R22 is electrically connected to the node N22. The other end of the resistor R22 is electrically connected to a node N24. One end of the resistor R23 is electrically connected to the node N24. The other end of the resistor R23 is electrically connected to the node N23.

The resistors R22 and R23 generate a voltage obtained by dividing a voltage between the nodes N22 and N23 by the resistors R22 and R23. The voltage generated by the resistors R22 and R23 is a voltage of the node N24.

The differential inverting circuit 31*b* includes resistors R31 to R37, capacitors C31 and C32, and transistors Q31, Q32, and Q33.

One end of the resistor R31 is electrically connected to the node N21. The other end of the resistor R31 is electrically connected to a node N31. One end of the capacitor C31 is electrically connected to the node N31. The other end of the capacitor C31 is electrically connected to the reference potential. The capacitor C31 drops a radio frequency signal at the node N31 to the reference potential.

A collector of the transistor Q31 is electrically connected to the node N31. A bias voltage is inputted to the collector of the transistor Q31 from the node N31.

The transistor Q31 is a replica transistor that simulates an operation of the transistor Q1 (see FIG. 1).

The transistor Q31 corresponds to an example of a "replica transistor" of the present disclosure.

One end of the capacitor C32 is electrically connected to the connection point Pin_rep. The radio frequency input signal RFin is inputted to the one end of the capacitor C32 through the connection point Pin_rep. The capacitor C32 is a DC-cut capacitor that cuts the direct-current components of the radio frequency input signal RFin.

One end of the resistor R34 is electrically connected to the other end of the capacitor C32. The other end of the resistor R34 is electrically connected to a base of the transistor Q31.

One end of the resistor R35 is electrically connected to the node N24. The other end of the resistor R35 is electrically connected to the one end of the resistor R34.

The capacitor C32, the resistor R34, the resistor R35, and the transistor Q31 may be formed as one cell CL31 on a semiconductor chip.

A case where the cell CL31 and the cell CL1 (see FIG. 1) are disposed as the same type of cell is exemplified.

The transistor Q31 is preferably disposed near the transistor Q1 (see FIG. 1). Accordingly, a temperature difference between the transistor Q31 and the transistor Q1 is suppressed, and a difference in characteristics between the transistor Q31 and the transistor Q1 is suppressed.

As the fact that the transistor Q31 is disposed in the vicinity of the transistor Q1, for example, a case where the cell CL31 is disposed adjacent to the cell CL1 is exemplified (see FIG. 1). In addition, for example, there are no other elements between the cell CL31 and the cell CL1.

A bias voltage is inputted from the node N24 to the base of the transistor Q31 through the resistor R35 and the resistor R34. In addition, the radio frequency input signal RFin is inputted to the base of the transistor Q31 through the capacitor C32 and the resistor R34.

An emitter of the transistor Q31 is electrically connected to one end of the resistor R36. The other end of the resistor R36 is electrically connected to a node N33.

One end of the resistor R32 is electrically connected to the node N21. The other end of the resistor R32 is electrically connected to a node N32. A voltage of the node N32 is the signal S11.

A collector of the transistor Q32 is electrically connected to the node N32. A bias voltage is inputted to the collector of the transistor Q32 from the node N32.

One end of the resistor R33 is electrically connected to the node N22. The other end of the resistor R33 is electrically connected to a base of the transistor Q32.

A bias voltage is inputted from the node N22 to the base of the transistor Q32 through the resistor R33.

An emitter of the transistor Q32 is electrically connected to one end of the resistor R37. The other end of the resistor R37 is electrically connected to the node N33.

A collector of the transistor Q33 is electrically connected to the node N33. An emitter of the transistor Q33 is electrically connected to the reference potential. A base of the transistor Q33 is electrically connected to the node N23. That is, the transistor Q33 is current-mirror-connected to the transistor Q22.

The current drawing circuit 31*c* includes a constant voltage source B41, transistors Q41, Q42, and Q43, and resistors R41 and R42.

The constant voltage source B41 outputs a constant voltage to a collector of the transistor Q41.

A base of the transistor Q41 is electrically connected to the node N32, and is inputted with the signal S11. An emitter of the transistor Q41 is electrically connected to one end of the resistor R41. The other end of the resistor R41 is electrically connected to a node N41.

A collector of the transistor Q42 is electrically connected to the node N41. An emitter of the transistor Q42 is electrically connected to the reference potential. A base of the transistor Q42 is electrically connected to the node N23. That is, the transistor Q42 is current-mirror-connected to the transistor Q22.

An emitter of the transistor Q43 is electrically connected to the reference potential. A base of the transistor Q43 is electrically connected to the node N41. A collector of the transistor Q43 is electrically connected to one end of the resistor R42. The other end of the resistor R42 is electrically connected to the connection point Vsink1. That is, the other end of the resistor R42 is electrically connected to the node N12 (see FIG. 1).

An operation of the bias suppression circuit 31 will be described.

When the radio frequency input signal RFin is relatively large (for example, when an excessive input occurs), a current between the collector and the emitter of the transistor Q31 becomes relatively large. Thus, a current between the collector and the emitter of the transistor Q32 becomes relatively small. This causes a voltage drop across the resistor R32 to become relatively small. Accordingly, a potential of the node N32 becomes relatively high. That is, the signal S11 has a relatively high potential.

When the signal S11 becomes equal to or higher than a base threshold voltage of the transistor Q41 (that is, when the radio frequency input signal RFin becomes equal to or higher than a threshold value), the transistor Q41 is turned on and a potential of the node N41 becomes relatively high. Thus, the transistor Q43 is turned on, and a current flows from the collector of the transistor Q43, that is, the connection point Vsink1 (that is, the node N12 (see FIG. 1)) to the emitter thereof. That is, the transistor Q43 draws a current from the node N12.

Thus, the voltage of the node N11 (see FIG. 1), that is, the base voltage of the transistor Q13 (see FIG. 1) decreases. In addition, a base current flowing from the node N11 to the transistor Q13 decreases. Accordingly, the bias current BIAS1 (see FIG. 1) outputted from the emitter of the transistor Q13 is suppressed.

Note that the bias suppression circuit 31 can finely adjust a current to be drawn from the node N12 by adjusting the element values of the respective elements. That is, the bias suppression circuit 31 can finely adjust the base voltage and the base current of the transistor Q13 without setting the base voltage and the base current to zero. Thus, the bias suppression circuit 31 can finely adjust the bias current BIAS1 instead of setting the bias current BIAS1 to zero.

On the other hand, when the radio frequency input signal RFin is relatively small, a current between the collector and the emitter of the transistor Q31 becomes relatively small. Thus, a current between the collector and the emitter of the transistor Q32 becomes relatively large. Accordingly, a voltage drop across the resistor R32 becomes relatively large. As a result, a potential of the node N32 becomes relatively low. That is, the signal S11 has a relatively low potential.

When the signal S11 becomes lower than the base threshold voltage of the transistor Q41 (that is, when the radio frequency input signal RFin becomes lower than the threshold voltage), the transistor Q41 is turned off, and a potential of the node N41 becomes relatively low. As a result, the transistor Q43 is turned off, and no current flows from the collector of the transistor Q43, that is, the connection point Vsink1 (that is, the node N12 (see FIG. 1)) to the emitter thereof. That is, the transistor Q43 does not draw a current from the node N12.

Effects

Without the bias suppression circuit 31, in the power amplifier 1, when the radio frequency input signal RFin becomes large (for example, when an excessive input occurs) and a change in load is applied (for example, when a light load is applied), a current between the collector and the emitter of the transistor Q1 becomes large, and the transistor Q1 may be damaged.

However, the power amplifier 1 includes the bias suppression circuit 31. Then, the bias suppression circuit 31 suppresses the bias current BIAS1 when the radio frequency input signal RFin becomes equal to or higher than the threshold value (for example, when an excessive input occurs).

Accordingly, in the power amplifier 1, since the current between the collector and the emitter of the transistor Q1 is suppressed, the damage of the transistor Q1 can be suppressed.

Additionally, when the radio frequency input signal RFin is equal to or higher than the threshold value, the bias suppression circuit 31 draws a current from the node N12. However, the bias suppression circuit 31 can finely adjust the base voltage and the base current of the transistor Q13 without setting the base voltage and the base current to zero. That is, the bias suppression circuit 31 can finely adjust the bias current BIAS1 instead of setting the bias current BIAS1 to zero. That is, the transistor Q1 can maintain an on-state without being turned off.

As a result, in the power amplifier 1, when the radio frequency input signal RFin returns from a value equal to or higher than the threshold value to a value less than the threshold value, the transistor Q1 can immediately return to the original amplifying operation.

Second Embodiment

Among the constituent elements of a second embodiment, the same constituent elements as the constituent elements of the first embodiment are given the same reference signs, and the description thereof is omitted.

Figure 3:
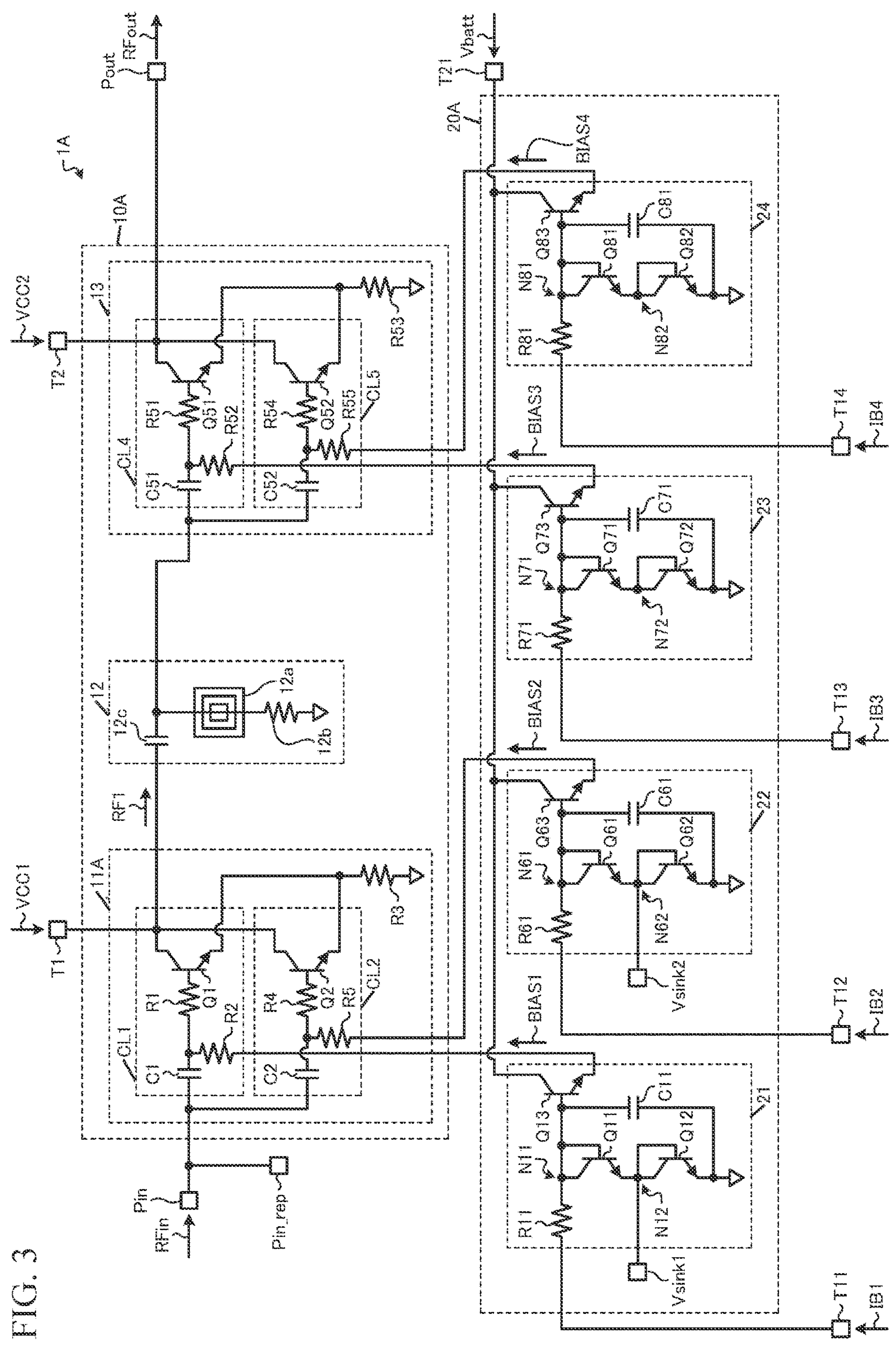
FIG. 3 is a diagram illustrating a configuration of a power amplifier according to a second embodiment.
Figure 4:
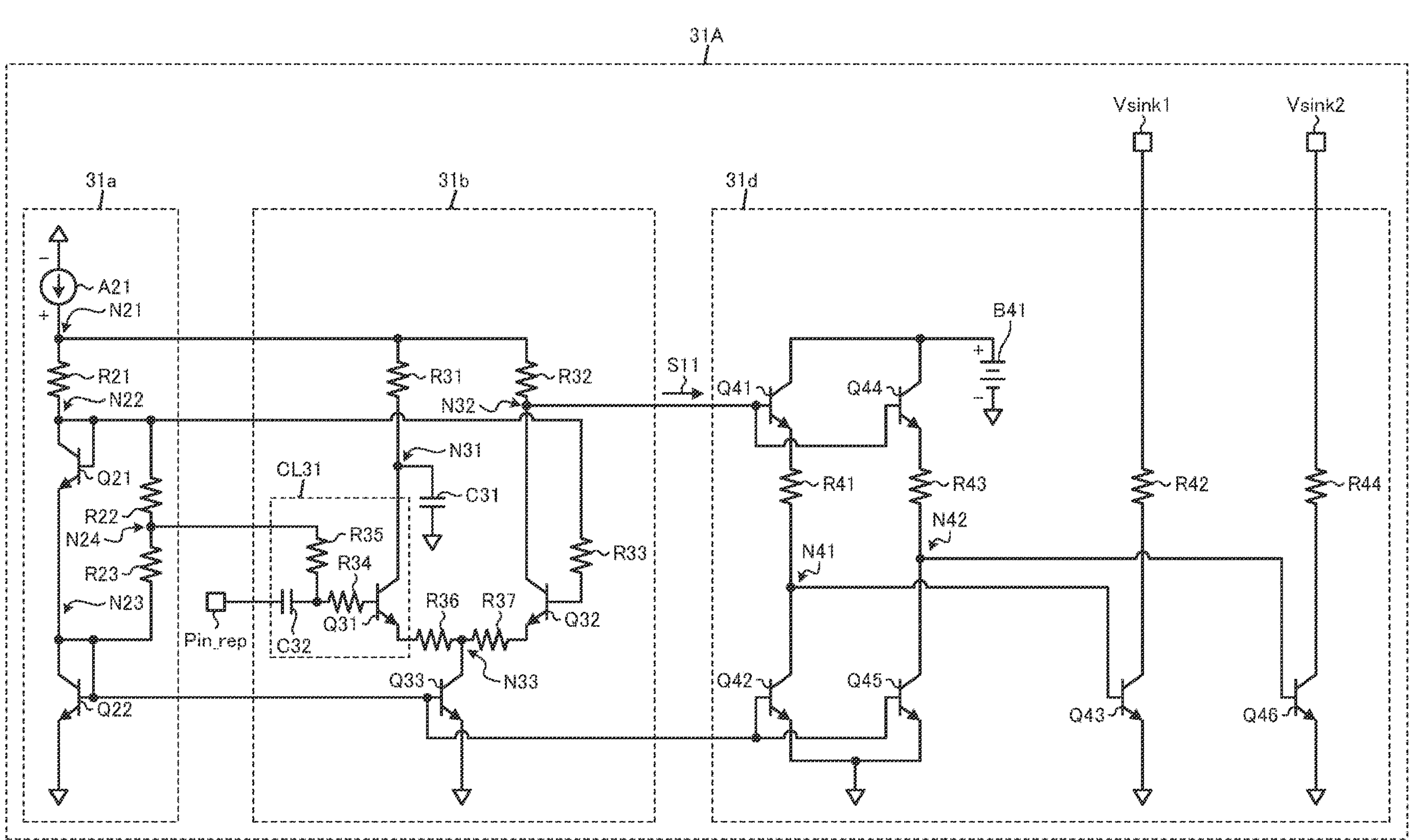
FIG. 4 is a diagram illustrating a configuration of a bias suppression circuit of the power amplifier according to the second embodiment.

Each of FIG. 3 and FIG. 4 is a diagram illustrating a configuration of a power amplifier according to the second embodiment. A power amplifier 1A includes an amplifier circuit 10A, a bias circuit 20A, and a bias suppression circuit 31A. FIG. 3 is a diagram illustrating the amplifier circuit 10A and the bias circuit 20A. FIG. 4 is a diagram illustrating the bias suppression circuit 31A.

The amplifier circuit 10A includes a first circuit 11A, a matching circuit 12, and a second circuit 13.

The bias circuit 20A includes a first bias circuit 21, a second bias circuit 22, a third bias circuit 23, and a fourth bias circuit 24.

The amplifier circuit 10A is a two-stage amplifier circuit including the first circuit 11A that is an amplifier circuit at a drive stage and the second circuit 13 that is an amplifier circuit at a power stage.

The power amplifier 1A has a first output power operation mode (hereinafter referred to as a "high power mode") in which amplification is performed at a relatively high first output power and a second output power operation mode (hereinafter referred to as a "low power mode") in which amplification is performed at a relatively low second output power.

Referring to FIG. 3, the first circuit 11A includes the capacitor C1, the resistors R1 and R2, the transistor Q1, a capacitor C2, resistors R4 and R5, a transistor Q2, and the resistor R3.

In the high power mode, the transistor Q1 amplifies the radio frequency input signal RFin and outputs a radio frequency signal RF1.

In both of the high power mode and the low power mode, the transistor Q2 amplifies the radio frequency input signal RFin and outputs the radio frequency signal RF1.

Since connection relationships, operations, and functions of the capacitor C2, the resistors R4 and R5, and the transistor Q2 are the same as the connection relationships, the operations, and the functions of the capacitor C1, the resistors R1 and R2, and the transistor Q1, the description thereof is omitted.

The transistor Q1 corresponds to an example of a "first amplifier transistor" of the present disclosure. The transistor Q2 corresponds to an example of a "second amplifier transistor" of the present disclosure.

One end of the capacitor C2 is electrically connected to one end of the capacitor C1. A collector of the transistor Q2 is electrically connected to the collector of the transistor Q1. An emitter of the transistor Q2 is electrically connected to one end of the resistor R3.

That is, the transistor Q1 and the transistor Q2 are connected in parallel.

The capacitor C2, the resistors R4 and R5, and the transistor Q2 may be formed as one cell CL2 on a semiconductor chip.

The matching circuit 12 performs the impedance matching between the first circuit 11A and the second circuit 13.

The matching circuit 12 includes an inductor 12*a*, a resistor 12*b*, and a capacitor 12*c*. One end of the capacitor 12*c* is electrically connected to the collector of the transistor Q1 and the collector of the transistor Q2. One end of the inductor 12*a* is electrically connected to the other end of the capacitor 12*c*. The other end of the inductor 12*a* is electrically connected to one end of the resistor 12*b*. The other end of the resistor 12*b* is electrically connected to the reference potential.

The circuit configuration of the matching circuit 12 is an example, and the present disclosure is not limited thereto.

The second circuit 13 includes a capacitor C51, resistors R51 and R52, a transistor Q51, a capacitor C52, resistors R54 and R55, a transistor Q52, and a resistor R53.

In the high power mode, the transistor Q51 amplifies the radio frequency signal RF1 and outputs the radio frequency output signal RFout.

In both of the high power mode and the low power mode, the transistor Q52 amplifies the radio frequency signal RF1 and outputs the radio frequency output signal RFout.

Since connection relationships, operations, and functions of the capacitor C51, the resistors R51 and R52, and the transistor Q51 are the same as the connection relationships, the operations, and the functions of the capacitor C1, the resistors R1 and R2, and the transistor Q1, the description thereof is omitted. The capacitor C51, the resistors R51 and R52, and the transistor Q51 may be formed as one cell CL4 on a semiconductor chip.

The transistor Q51 corresponds to an example of a "third amplifier transistor" of the present disclosure.

One end of the capacitor C51 is electrically connected to one end of the inductor 12*a*. A power supply voltage VCC2 is inputted to a collector of the transistor Q51 through the terminal T2. The collector of the transistor Q51 is electrically connected to the terminal Pout. An emitter of the transistor Q51 is electrically connected to one end of the resistor R53. The other end of the resistor R53 is electrically connected to the reference potential.

Since connection relationships, operations, and functions of the capacitor C52, the resistors R54 and R55, and the transistor Q52 are the same as the connection relationships, the operations, and the functions of the capacitor C1, the resistors R1 and R2, and the transistor Q1, the description thereof is omitted. The capacitor C52, the resistors R54 and R55, and the transistor Q52 may be formed as one cell CL5 on a semiconductor chip.

The transistor Q52 corresponds to an example of a "fourth amplifier transistor" of the present disclosure.

One end of the capacitor C52 is electrically connected to the one end of the capacitor C51. A collector of the transistor Q52 is electrically connected to the collector of the transistor Q51. An emitter of the transistor Q52 is electrically connected to the one end of the resistor R53.

That is, the transistor Q51 and the transistor Q52 are connected in parallel.

In the high power mode, the bias current IB1 is inputted to the first bias circuit 21 from the outside through the terminal T11. In the high power mode, the first bias circuit 21 outputs the bias current BIAS1 to the cell CL1 based on the bias current IB1.

In both of the high power mode and the low power mode, a bias current IB2 is inputted to the second bias circuit 22 from the outside through a terminal T12. In both of the high power mode and the low power mode, the second bias circuit 22 outputs a bias current BIAS2 to the cell CL2 based on the bias current IB2.

The second bias circuit 22 includes a resistor R61, transistors Q61, Q62, and Q63, and a capacitor C61.

Since connection relationships, operations, and functions of the resistor R61, the transistors Q61, Q62, and Q63, and the capacitor C61 are the same as the connection relationships, the operations, and the functions of the resistor R11, the transistors Q11, Q12, and Q13, and the capacitor C11, and the description thereof will be omitted.

A node N62 that is a connection point between an emitter of the transistor Q61 and a collector and a base of the transistor Q62 is electrically connected to a connection point Vsink2. Note that the connection point Vsink2 is provided for convenience of description, and does not need to be provided in an actual circuit (may be a simple wiring).

In the high power mode, a bias current IB3 is inputted to the third bias circuit 23 from the outside through a terminal T13. In the high power mode, the third bias circuit 23 outputs a bias current BIAS3 to the cell CL4 based on the bias current IB3.

The third bias circuit 23 includes a resistor R71, transistors Q71, Q72, and Q73, and a capacitor C71.

Since connection relationships, operations, and functions of the resistor R71, the transistors Q71, Q72, and Q73, and the capacitor C71 are the same as the connection relationships, the operations, and the functions of the resistor R11, the transistors Q11, Q12, and Q13, and the capacitor C11, and the description thereof is omitted.

In both of the high power mode and the low power mode, a bias current IB4 is inputted to the fourth bias circuit 24 from the outside through a terminal T14. In both of the high power mode and the low power mode, the fourth bias circuit 24 outputs a bias current BIAS4 to the cell CL5 based on the bias current IB4.

The fourth bias circuit 24 includes a resistor R81, transistors Q81, Q82, and Q83, and a capacitor C81.

Since connection relationships, operations, and functions of the resistor R81, the transistors Q81, Q82, and Q83, and the capacitor C81 are the same as the connection relationships, the operations, and the functions of the resistor R11, the transistors Q11, Q12, and Q13, and the capacitor C11, and the description thereof is omitted.

Referring to FIG. 4, the bias suppression circuit 31A includes a current drawing circuit 31*d* instead of the current drawing circuit 31*c*, as compared with the bias suppression circuit 31 (see FIG. 2).

As compared with the current drawing circuit 31*c*, the current drawing circuit 31*d* further includes transistors Q44, Q45, and Q46, and resistors R43 and R44.

Since connection relationships, operations, and functions of the transistors Q44, Q45, and Q46 and the resistors R43 and R44 are the same as the connection relationships, the operations, and the functions of the transistors Q41, Q42, and Q43 and the resistors R41 and R42, and thus, the description thereof is omitted.

The other end of the resistor R44 is electrically connected to the connection point Vsink2. That is, the other end of the resistor R44 is electrically connected to the node N62 (see FIG. 3).

Note that although a base of the transistor Q46 is electrically connected to the node N42 that is a connection point between the other end of the resistor R43 and a collector of the transistor Q45 in the second embodiment, the base may be electrically connected to the node N41. Thus, the transistors Q44 and Q45 and the resistor R43 can be eliminated, and the number of elements can be reduced.

An operation of the bias suppression circuit 31A will be described.

When the radio frequency input signal RFin is relatively large (for example, when an excessive input occurs), a current between the collector and the emitter of the transistor Q31 becomes relatively large. Thus, a current between the collector and the emitter of the transistor Q32 becomes relatively small. This causes a voltage drop across the resistor R32 to become relatively small. Accordingly, a potential of the node N32 becomes relatively high. That is, the signal S11 has a relatively high potential.

When the signal S11 becomes equal to or higher than a base threshold voltage of the transistor Q41 (that is, when the radio frequency input signal RFin becomes equal to or higher than the threshold value), the transistor Q41 is turned on and a potential of the node N41 becomes relatively high. Thus, the transistor Q43 is turned on, and a current flows from the collector of the transistor Q43, that is, the connection point Vsink1 (that is, the node N12 (see FIG. 3)) to the emitter thereof. That is, the transistor Q43 draws a current from the node N12.

Thus, the voltage of the node N11 (see FIG. 3), that is, a base voltage of the transistor Q13 (see FIG. 3) decreases. In addition, a base current flowing from the node N11 to the transistor Q13 decreases. Accordingly, the bias current BIAS1 (see FIG. 3) outputted from the emitter of the transistor Q13 is suppressed. Thus, the radio frequency signal RF1 is suppressed.

Note that the bias suppression circuit 31A can finely adjust a current to be drawn from the node N12 by adjusting the element values of the respective elements. That is, the bias suppression circuit 31A can finely adjust the base voltage and the base current of the transistor Q13 without setting the base voltage and the base current to zero. Thus, the bias suppression circuit 31A can finely adjust the bias current BIAS1 instead of setting the bias current BIAS1 to zero.

When the signal S11 becomes equal to or higher than a base threshold voltage of the transistor Q44 (that is, when the radio frequency input signal RFin becomes equal to or higher than the threshold value), the transistor Q44 is turned on and a potential of the node N42 becomes relatively high. As a result, the transistor Q46 is turned on, and a current flows from a collector of the transistor Q46, that is, the connection point Vsink2 (that is, the node N62 (see FIG. 3)) to an emitter thereof. That is, the transistor Q46 draws a current from the node N62.

Thus, a voltage of the node N61 (see FIG. 3), that is, a base voltage of the transistor Q63 (see FIG. 3) decreases. In addition, a base current flowing from the node N61 to the transistor Q63 decreases. This suppresses the bias current BIAS2 (see FIG. 3) outputted from an emitter of the transistor Q63. Thus, the radio frequency signal RF1 is suppressed.

Note that the bias suppression circuit 31A can finely adjust a current to be drawn from the node N62 by adjusting the element values of the respective elements. That is, the bias suppression circuit 31A can finely adjust the base voltage and the base current of the transistor Q63 without setting the base voltage and the base current to zero. Thus, the bias suppression circuit 31A can finely adjust the bias current BIAS2 instead of setting the bias current BIAS2 to zero.

On the other hand, when the radio frequency input signal RFin is relatively small, a current between the collector and the emitter of the transistor Q31 becomes relatively small. Thus, a current between the collector and the emitter of the transistor Q32 becomes relatively large. Accordingly, a voltage drop across the resistor R32 becomes relatively large. As a result, a potential of the node N32 becomes relatively low. That is, the signal S11 has a relatively low potential.

When the signal S11 becomes lower than the base threshold voltage of the transistor Q41 (that is, when the radio frequency input signal RFin becomes lower than the threshold voltage), the transistor Q41 is turned off, and a potential of the node N41 becomes relatively low. As a result, the transistor Q43 is turned off, and no current flows from the collector of the transistor Q43, that is, the connection point Vsink1 (that is, the node N12 (see FIG. 3)) to the emitter thereof. That is, the transistor Q43 does not draw a current from the node N12.

When the signal S11 becomes lower than the base threshold voltage of the transistor Q44 (that is, when the radio frequency input signal RFin becomes lower than the threshold value), the transistor Q44 is turned off, and a potential of the node N42 becomes relatively low. As a result, the transistor Q46 is turned off, and no current flows from the collector of the transistor Q46, that is, the connection point Vsink2 (that is, the node N62 (see FIG. 3)) to the emitter thereof. That is, the transistor Q46 does not draw a current from the node N62.

Effects

In a case where the bias suppression circuit 31A is not provided, in the power amplifier 1A, when the radio frequency input signal RFin becomes large (for example, when an excessive input occurs), that is, when the radio frequency signal RF1 becomes large and a change in load is applied (for example, when a light load is applied), the transistor Q51 and the transistor Q52 may be damaged.

However, the power amplifier 1A includes the bias suppression circuit 31A. Then, the bias suppression circuit 31A suppresses the bias current BIAS1 and the bias current BIAS2 when the radio frequency input signal RFin becomes equal to or higher than the threshold value (for example, when an excessive input occurs).

As a result, in the power amplifier 1A, the radio frequency signal RF1 is suppressed and a current between the collector and the emitter of each of the transistor Q51 and the transistor Q52 is suppressed, so that damage of the transistor Q51 and the transistor Q52 can be suppressed.

Additionally, when the radio frequency input signal RFin is equal to or higher than the threshold value, the bias suppression circuit 31A draws a current from each of the node N12 and the node N62. However, the bias suppression circuit 31A can finely adjust the base voltage and the base current of each of the transistor Q13 and the transistor Q63 without setting the base voltage and the base current to zero. That is, the bias suppression circuit 31A can finely adjust the bias current BIAS1 and the bias current BIAS2 without setting the bias current BIAS1 and the bias current BIAS2 to zero. That is, each of the transistor Q1 and the transistor Q2 can maintain an on state without being turned off.

Thus, in the power amplifier 1A, when the radio frequency input signal RFin returns from a value equal to or higher than the threshold value to a value less than the threshold value, the transistor Q1 and the transistor Q2 can immediately return to the original amplifying operation.

Circuit Simulation Results

Figure 5:
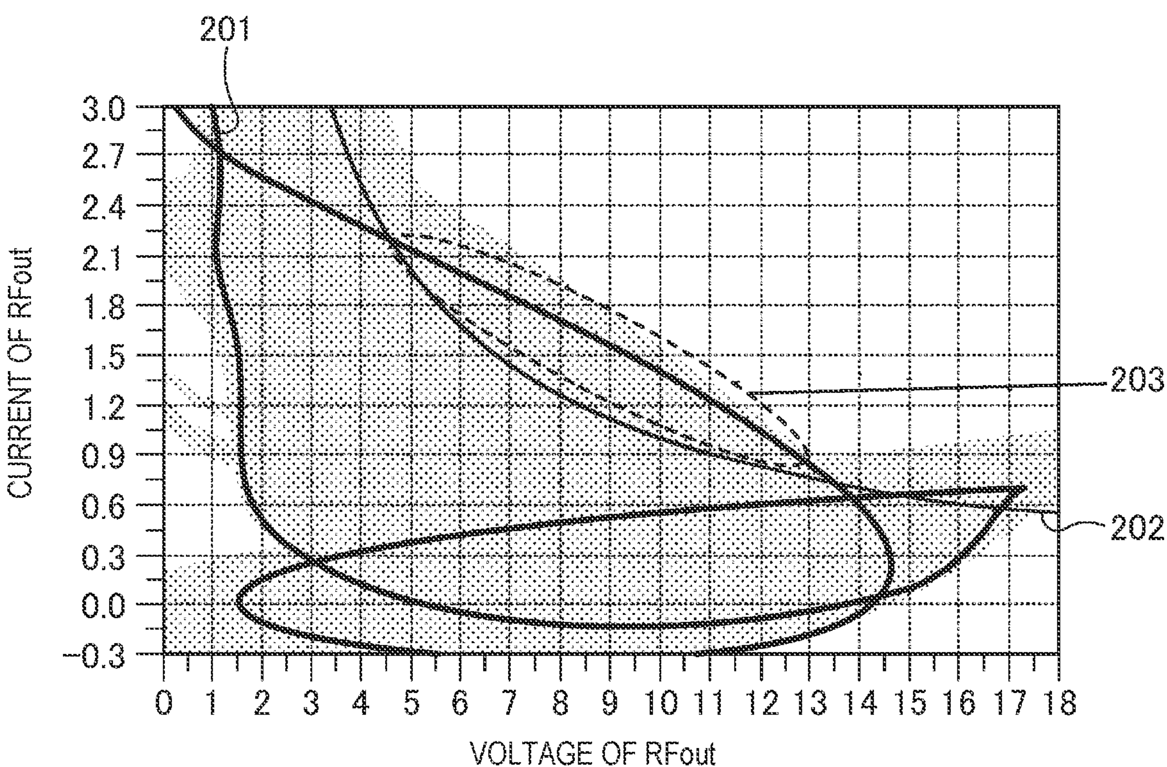
FIG. 5 is a graph illustrating a circuit simulation result of a power amplifier of a comparative example.
Figure 6:
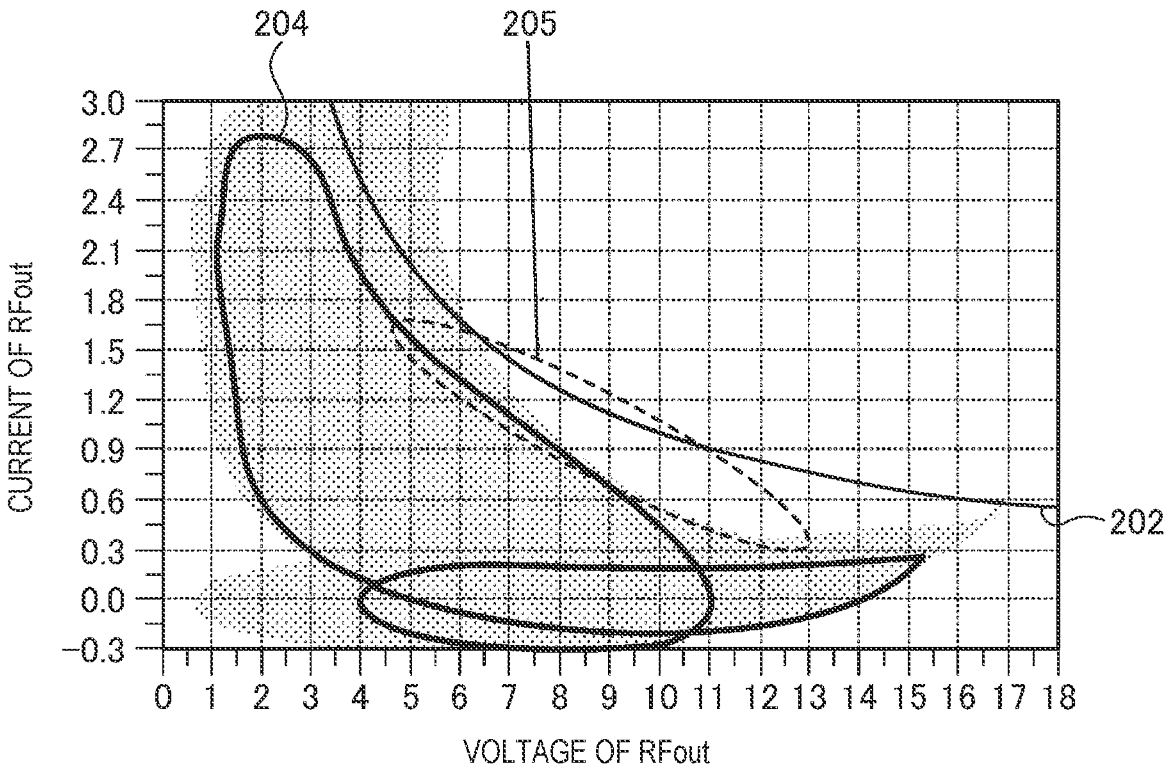
FIG. 6 is a graph illustrating a circuit simulation result of the power amplifier according to the second embodiment.

FIG. 5 and FIG. 6 are graphs respectively illustrating circuit simulation results of a power amplifier according to a comparative example and the power amplifier according to the second embodiment.

FIG. 5 is the circuit simulation result of the power amplifier according to the comparative example. FIG. 5 is a graph illustrating a load line (a Lissajous waveform of a current and a voltage of the radio frequency output signal RFout) of the transistors Q51 and Q52 (see FIG. 3) when the bias suppression circuit 31A is not provided.

FIG. 6 is the circuit simulation result of the power amplifier according to the second embodiment. FIG. 6 is a graph illustrating a load line of the transistors Q51 and Q52 when the bias suppression circuit 31A is provided.

In FIG. 5 and FIG. 6, a plurality of waveforms when the impedance of a load connected subsequent to the power amplifier 1A is changed is indicated by hatching.

Referring to FIG. 5, a thick solid line 201 is an example of a load line of the transistor Q51 and the transistor Q52. A thin solid line 202 is an isoelectric line of 10 W (watt).

In a region 203, the thick solid line 201 is on the upper side than the thin solid line 202 in the figure, and the second circuit 13 has an excessive output power (due to an excessive input power).

Referring to FIG. 6, a thick solid line 204 is an example of a load line of the transistor Q51 and the transistor Q52.

In a region 205, the thick solid line 204 is on the lower side than the thin solid line 202 in the figure, and the second circuit 13 does not have an excessive output power (due to an excessive input power).

In this way, the bias suppression circuit 31A can suppress the excessive input power to the second circuit 13. Thus, the bias suppression circuit 31A can suppress the damage of the second circuit 13.

Third Embodiment

Among the constituent elements of a third embodiment, the same constituent elements as the constituent elements of the other embodiments are denoted by the same reference signs, and the description thereof is omitted.

Figure 7:
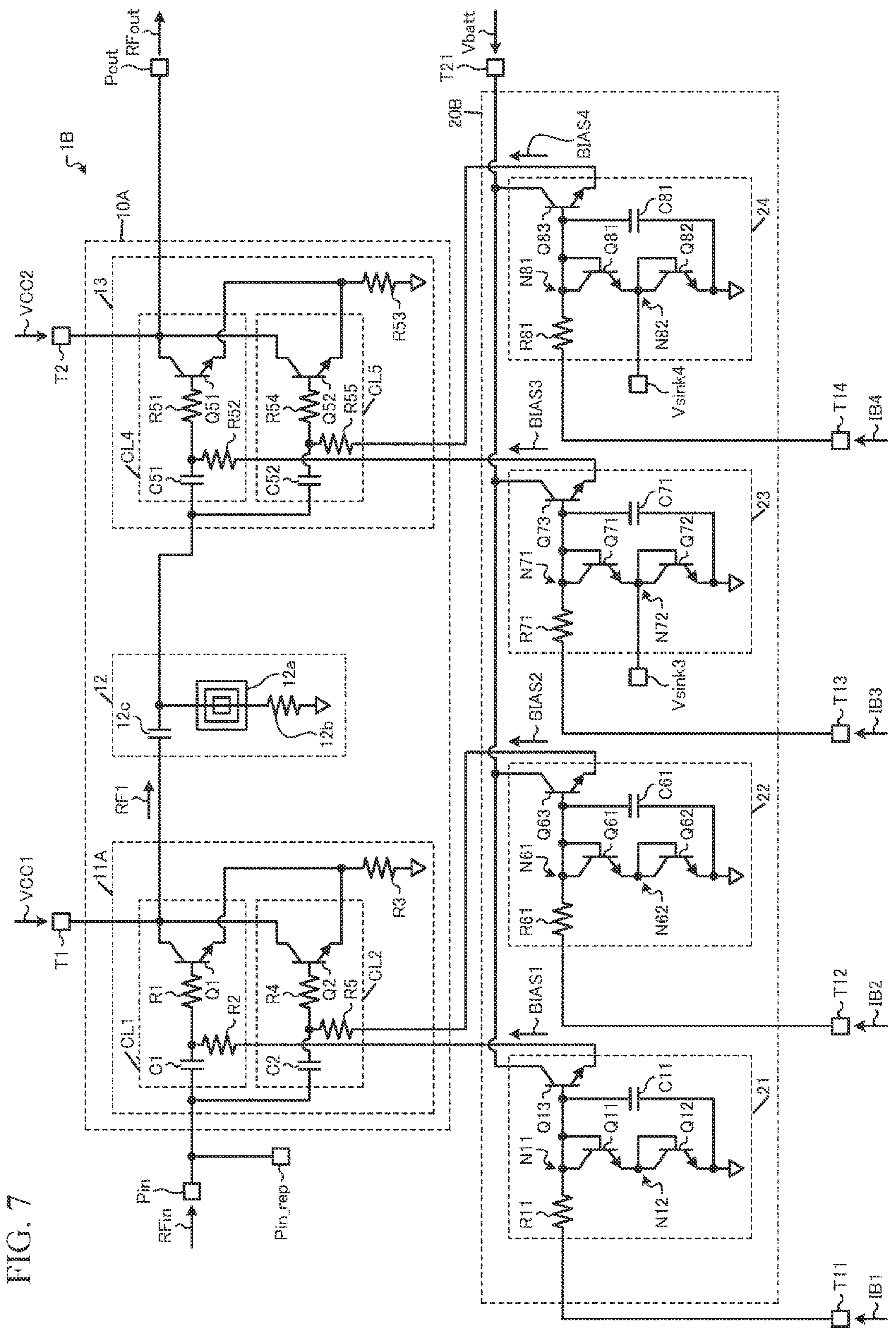
FIG. 7 is a diagram illustrating a configuration of a power amplifier according to a third embodiment.
Figure 8:
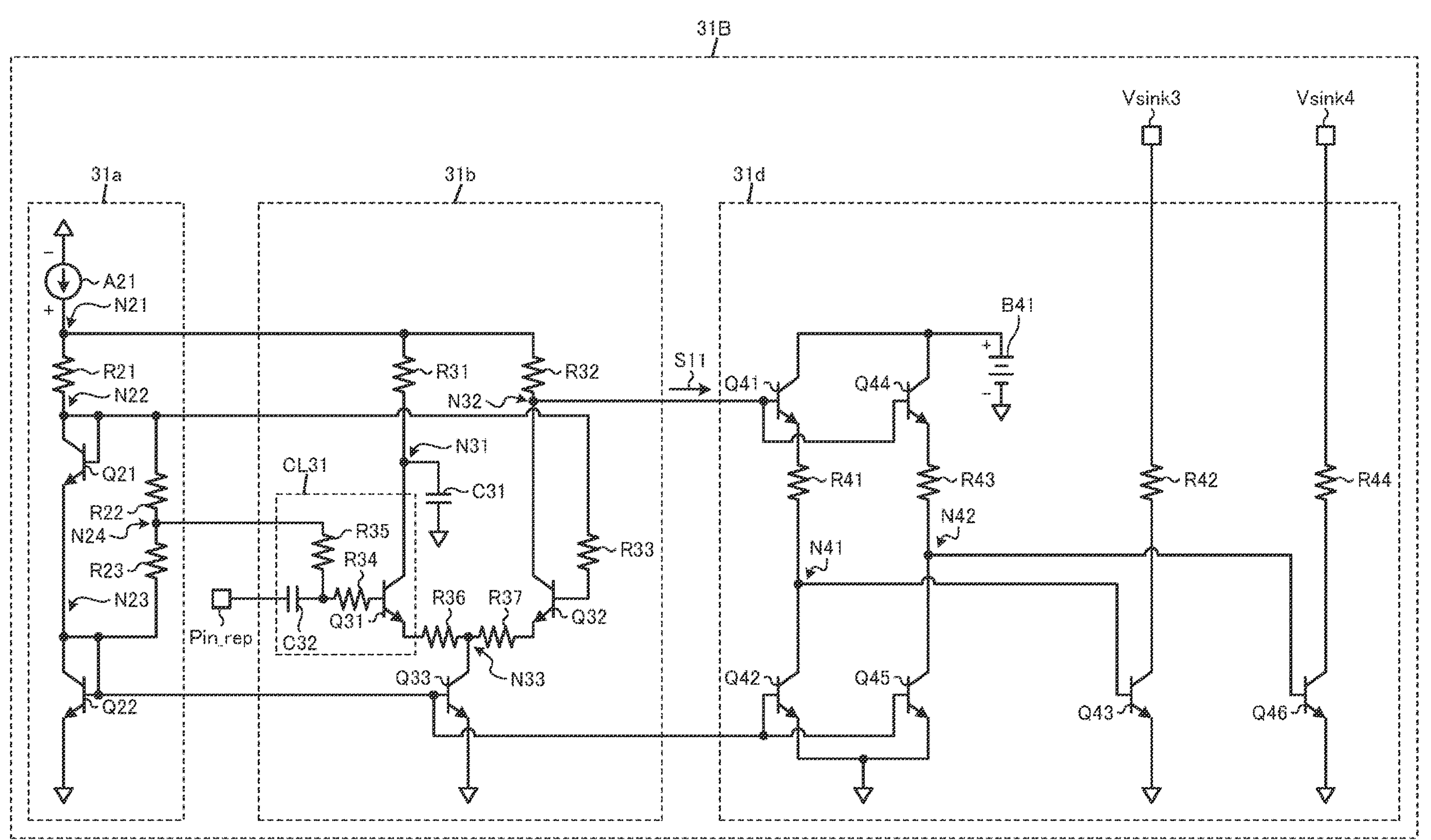
FIG. 8 is a diagram illustrating a configuration of a bias suppression circuit of the power amplifier according to the third embodiment.

FIG. 7 and FIG. 8 are diagrams illustrating configurations of a power amplifier according to the third embodiment. A power amplifier 1B includes the amplifier circuit 10A, a bias circuit 20B, and a bias suppression circuit 31B. FIG. 7 is a diagram illustrating the amplifier circuit 10A and the bias circuit 20B. FIG. 8 is a diagram illustrating the bias suppression circuit 31B.

Referring to FIG. 7, the bias circuit 20B is different from the bias circuit 20A (see FIG. 3) in that the node N12 is not connected to the connection point Vsink1. Further, the node N62 is not connected to the connection point Vsink2. On the other hand, a node N72 is electrically connected to a connection point Vsink3. Further, a node N82 is electrically connected to a connection point Vsink4. Note that the connection point Vsink3 and the connection point Vsink4 are provided for convenience of description, and do not need to be provided in an actual circuit (may be simple wirings).

Referring to FIG. 8, the bias suppression circuit 31B is different from the bias suppression circuit 31A (see FIG. 4) in that the other end of the resistor R42 is electrically connected to the connection point Vsink3 instead of the connection point Vsink1. Further, the other end of the resistor R44 is electrically connected to the connection point Vsink4 instead of the connection point Vsink2.

An operation of the bias suppression circuit 31B will be described.

When the radio frequency input signal RFin is relatively large (for example, when an excessive input occurs), a current between the collector and the emitter of the transistor Q31 becomes relatively large. Thus, a current between the collector and the emitter of the transistor Q32 becomes relatively small. This causes a voltage drop across the resistor R32 to become relatively small. Accordingly, a potential of the node N32 becomes relatively high. That is, the signal S11 has a relatively high potential.

When the signal S11 becomes equal to or higher than a base threshold voltage of the transistor Q41 (that is, when the radio frequency input signal RFin becomes equal to or higher than the threshold value), the transistor Q41 is turned on and a potential of the node N41 becomes relatively high. Thus, the transistor Q43 is turned on, and a current flows from the collector of the transistor Q43, that is, the connection point Vsink3 (that is, the node N72 (see FIG. 7)) to the emitter thereof. That is, the transistor Q43 draws a current from the node N72.

Accordingly, a voltage of the node N71 (see FIG. 7), that is, a base voltage of the transistor Q73 (see FIG. 7) decreases. In addition, a base current flowing from the node N71 to the transistor Q73 decreases. As a result, the bias current BIAS3 (see FIG. 7) outputted from an emitter of the transistor Q73 is suppressed.

Note that the bias suppression circuit 31B can finely adjust a current to be drawn from the node N72 by adjusting the element values of the respective elements. That is, the bias suppression circuit 31B can finely adjust the base voltage and the base current of the transistor Q73 instead of setting the base voltage and the base current to zero. Accordingly, the bias suppression circuit 31B can finely adjust the bias current BIAS3 instead of setting the bias current BIAS3 to zero.

When the signal S11 becomes equal to or higher than a base threshold voltage of the transistor Q44 (that is, when the radio frequency input signal RFin becomes equal to or higher than the threshold value), the transistor Q44 is turned on and a potential of the node N42 becomes relatively high. Thus, the transistor Q46 is turned on, and a current flows from the collector of the transistor Q46, that is, the connection point Vsink4 (that is, the node N82 (see FIG. 7)) to the emitter thereof. That is, the transistor Q46 draws a current from the node N82.

Accordingly, a voltage of the node N81 (see FIG. 7), that is, a base voltage of the transistor Q83 (see FIG. 7) decreases. In addition, a base current flowing from the node N81 to the transistor Q83 decreases. As a result, the bias current BIAS4 (see FIG. 7) outputted from an emitter of the transistor Q83 is suppressed.

Note that the bias suppression circuit 31B can finely adjust a current to be drawn from the node N82 by adjusting the element values of the respective elements. That is, the bias suppression circuit 31B can finely adjust the base voltage and the base current of the transistor Q83 without setting the base voltage and the base current to zero. Thus, the bias suppression circuit 31B can finely adjust the bias current BIAS4 instead of setting the bias current BIAS4 to zero.

On the other hand, when the radio frequency input signal RFin is relatively small, a current between the collector and the emitter of the transistor Q31 becomes relatively small. Thus, a current between the collector and the emitter of the transistor Q32 becomes relatively large. Accordingly, a voltage drop across the resistor R32 becomes relatively large. As a result, a potential of the node N32 becomes relatively low. That is, the signal S11 has a relatively low potential.

When the signal S11 becomes lower than the base threshold voltage of the transistor Q41 (that is, when the radio frequency input signal RFin becomes lower than the threshold voltage), the transistor Q41 is turned off, and a potential of the node N41 becomes relatively low. Accordingly, the transistor Q43 is turned off, and no current flows from the collector of the transistor Q43, that is, the connection point Vsink3 (that is, the node N72 (see FIG. 7)) to the emitter thereof. That is, the transistor Q43 does not draw a current from the node N72.

When the signal S11 becomes lower than the base threshold voltage of the transistor Q44 (that is, when the radio frequency input signal RFin becomes lower than the threshold value), the transistor Q44 is turned off, and a potential of the node N42 becomes relatively low. As a result, the transistor Q46 is turned off, and no current flows from the collector of the transistor Q46, that is, the connection point Vsink4 (that is, the node N82 (see FIG. 7)) to the emitter thereof. That is, the transistor Q46 does not draw a current from the node N82.

Effects

When the bias suppression circuit 31B is not provided, in the power amplifier 1B, when the radio frequency input signal RFin becomes large (for example, when an excessive input occurs), that is, when the radio frequency signal RF1 becomes large and a change in load is applied (for example, when a light load is applied), the transistor Q51 and the transistor Q52 may be damaged.

However, the power amplifier 1B includes the bias suppression circuit 31B. Then, the bias suppression circuit 31B suppresses the bias current BIAS3 and the bias current BIAS4 when the radio frequency input signal RFin becomes equal to or higher than the threshold value (for example, when an excessive input occurs).

Thus, in the power amplifier 1B, since the current between the collector and the emitter of each of the transistor Q51 and the transistor Q52 is suppressed, the damage of the transistor Q51 and the transistor Q52 can be suppressed.

Moreover, when the radio frequency input signal RFin is equal to or higher than the threshold value, the bias suppression circuit 31B draws a current from each of the node N72 and the node N82. However, the bias suppression circuit 31B can finely adjust a base voltage and a base current of each of the transistor Q73 and the transistor Q83 instead of setting the base voltage and the base current to zero. That is, the bias suppression circuit 31B can finely adjust the bias current BIAS3 and the bias current BIAS4 instead of setting the bias current BIAS3 and the bias current BIAS4 to zero. In other words, the transistor Q51 and the transistor Q52 can maintain an on state without being turned off.

As a result, in the power amplifier 1B, when the radio frequency input signal RFin returns from a value equal to or higher than the threshold value to a value less than the threshold value, the transistor Q51 and the transistor Q52 can immediately return to the original amplifying operation.

Fourth Embodiment

Among the constituent elements of the fourth embodiment, the same constituent elements as the constituent elements of the other embodiments are denoted by the same reference signs, and the description thereof is omitted.

Figure 9:
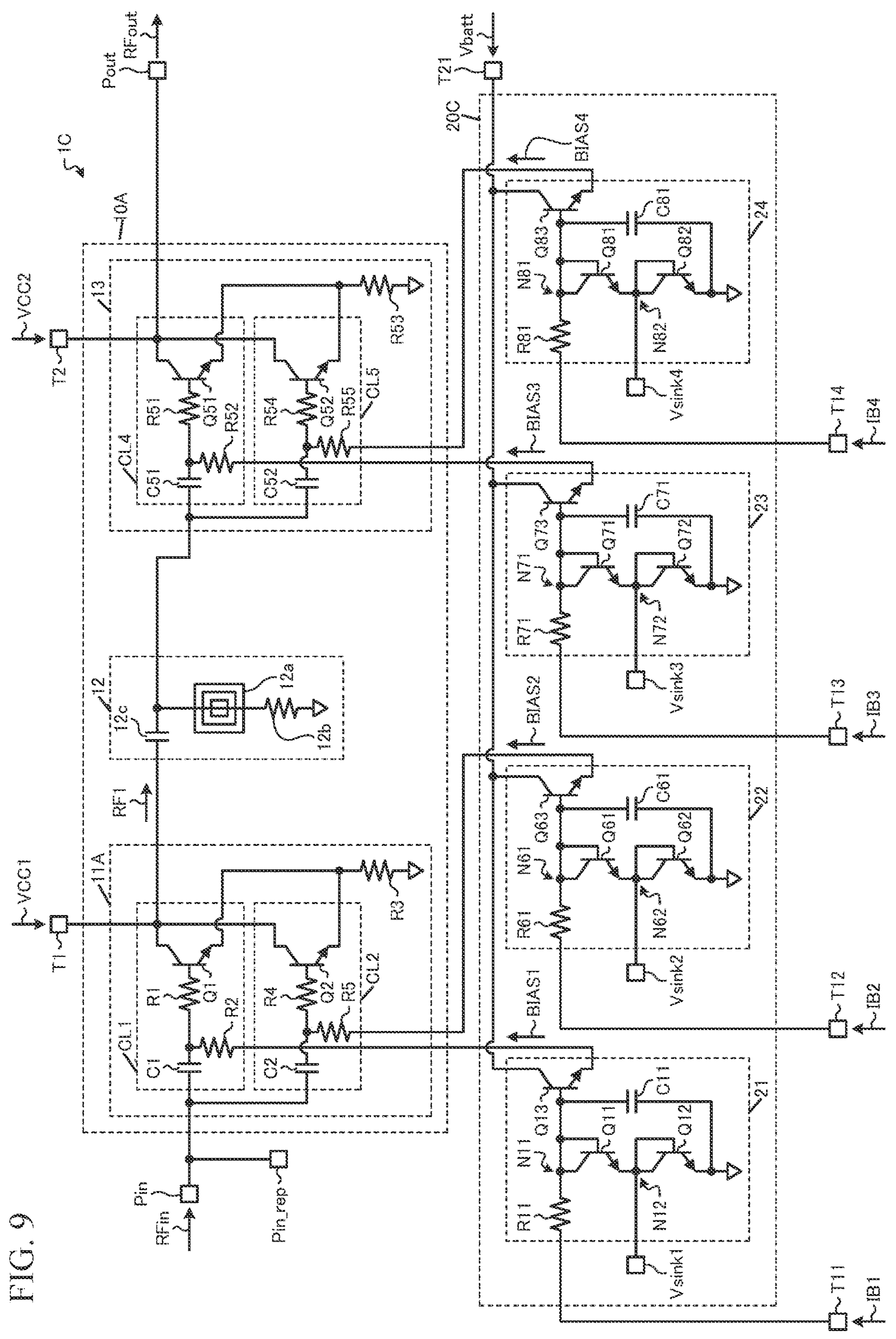
FIG. 9 is a diagram illustrating a configuration of a power amplifier according to a fourth embodiment.
Figure 10:
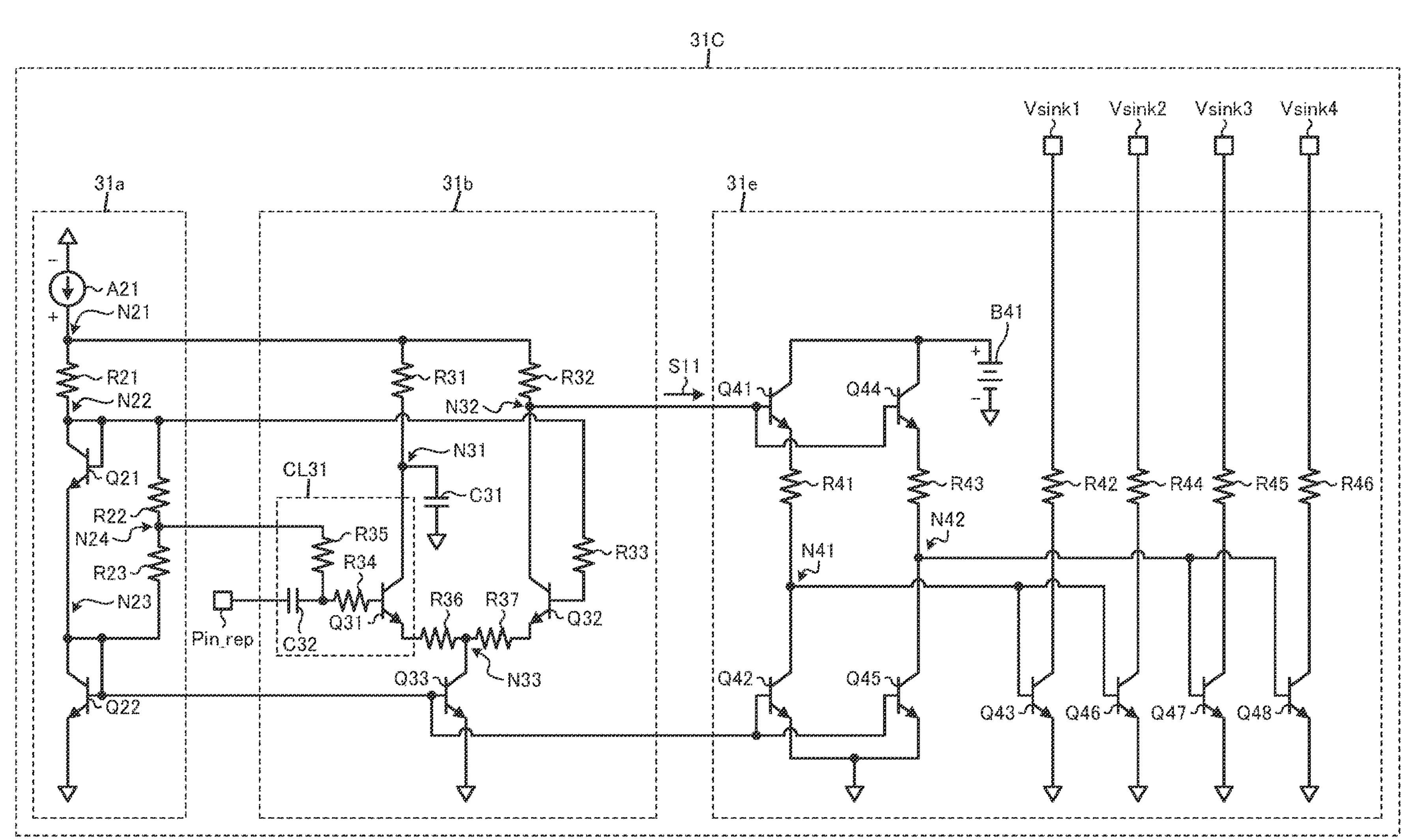
FIG. 10 is a diagram illustrating a configuration of a bias suppression circuit of the power amplifier according to the fourth embodiment.

FIG. 9 and FIG. 10 are diagrams illustrating configurations of a power amplifier according to a fourth embodiment. A power amplifier 1C includes the amplifier circuit 10A, a bias circuit 20C, and a bias suppression circuit 31C. FIG. 9 is a diagram illustrating the amplifier circuit 10A and the bias circuit 20C. FIG. 10 is a diagram illustrating the bias suppression circuit 31C.

Referring to FIG. 9, the bias circuit 20C is different from the bias circuit 20A (see FIG. 3) in that the node N72 is connected to the connection point Vsink3. Further, the node N82 is connected to the connection point Vsink4.

Referring to FIG. 10, the bias suppression circuit 31C includes a current drawing circuit 31*e* instead of the current drawing circuit 31*d*, as compared with the bias suppression circuit 31A (see FIG. 4). As compared with the current drawing circuit 31*d*, the current drawing circuit 31*e* further includes resistors R45 and R46 and transistors Q47 and Q48. Additionally, the base of the transistor Q46 is electrically connected to the node N41.

An emitter of the transistor Q47 is electrically connected to the reference potential. A base of the transistor Q47 is electrically connected to the node N42. A collector of the transistor Q47 is electrically connected to one end of the resistor R45. The other end of the resistor R45 is electrically connected to the connection point Vsink3. That is, the other end of the resistor R45 is electrically connected to the node N72 (see FIG. 9).

An emitter of the transistor Q48 is electrically connected to the reference potential. A base of the transistor Q48 is electrically connected to the node N42. A collector of the transistor Q48 is electrically connected to one end of the resistor R46. The other end of the resistor R46 is electrically connected to the connection point Vsink4. That is, the other end of the resistor R46 is electrically connected to the node N82 (see FIG. 9).

Note that in the fourth embodiment, the base of the transistor Q47 and the base of the transistor Q48 are electrically connected to the node N42, but may be electrically connected to the node N41. Thus, the transistors Q44 and Q45 and the resistor R43 can be eliminated, and the number of elements can be reduced.

An operation of the bias suppression circuit 31C will be described.

When the radio frequency input signal RFin is relatively large (for example, when an excessive input occurs), a current between the collector and the emitter of the transistor Q31 becomes relatively large. Thus, a current between the collector and the emitter of the transistor Q32 becomes relatively small. This causes a voltage drop across the resistor R32 to become relatively small. Accordingly, a potential of the node N32 becomes relatively high. That is, the signal S11 has a relatively high potential.

When the signal S11 becomes equal to or higher than a base threshold voltage of the transistor Q41 (that is, when the radio frequency input signal RFin becomes equal to or higher than the threshold value), the transistor Q41 is turned on and a potential of the node N41 becomes relatively high. Thus, the transistor Q43 is turned on, and a current flows from the collector of the transistor Q43, that is, the connection point Vsink1 (that is, the node N12 (see FIG. 9)) to the emitter thereof. That is, the transistor Q43 draws a current from the node N12.

Thus, the voltage of the node N11 (see FIG. 9), that is, a base voltage of the transistor Q13 (see FIG. 9) decreases. In addition, a base current flowing from the node N11 to the transistor Q13 decreases. Accordingly, the bias current BIAS1 (see FIG. 9) outputted from the emitter of the transistor Q13 is suppressed. Thus, the radio frequency signal RF1 is suppressed.

Note that the bias suppression circuit 31C can finely adjust a current to be drawn from the node N12 by adjusting the elements values of the respective elements. That is, the bias suppression circuit 31C can finely adjust the base voltage and the base current of the transistor Q13 instead of setting the base voltage and the base current to zero. Thus, the bias suppression circuit 31C can finely adjust the bias current BIAS1 instead of setting the bias current BIAS1 to zero.

When the signal S11 becomes equal to or higher than the base threshold voltage of the transistor Q41 (that is, when the radio frequency input signal RFin becomes equal to or higher than the threshold value), the transistor Q41 is turned on and a potential of the node N41 becomes relatively high. As a result, the transistor Q46 is turned on, and a current flows from the collector of the transistor Q46, that is, the connection point Vsink2 (that is, the node N62 (see FIG. 9)) to an emitter thereof. That is, the transistor Q46 draws a current from the node N62.

Thus, a voltage of the node N61 (see FIG. 9), that is, a base voltage of the transistor Q63 (see FIG. 9) decreases. In addition, a base current flowing from the node N61 to the transistor Q63 decreases. This suppresses the bias current BIAS2 (see FIG. 9) outputted from the emitter of the transistor Q63. Thus, the radio frequency signal RF1 is suppressed.

Note that the bias suppression circuit 31C can finely adjust a current to be drawn from the node N62 by adjusting the element values of the respective elements. That is, the bias suppression circuit 31C can finely adjust the base voltage and the base current of the transistor Q63 instead of setting the base voltage and the base current to zero. Thus, the bias suppression circuit 31C can finely adjust the bias current BIAS2 instead of setting the bias current BIAS2 to zero.

When the signal S11 becomes equal to or higher than a base threshold voltage of the transistor Q44 (that is, when the radio frequency input signal RFin becomes equal to or higher than the threshold value), the transistor Q44 is turned on and a potential of the node N42 becomes relatively high. Accordingly, the transistor Q47 is turned on, and a current flows from the collector of the transistor Q47, that is, the connection point Vsink3 (that is, the node N72 (see FIG. 9)) to the emitter thereof. That is, the transistor Q47 draws a current from the node N72.

Accordingly, a voltage of the node N71 (see FIG. 9), that is, a base voltage of the transistor Q73 (see FIG. 9) decreases. In addition, a base current flowing from the node N71 to the transistor Q73 decreases. As a result, the bias current BIAS3 (see FIG. 9) outputted from the emitter of the transistor Q73 is suppressed.

The bias suppression circuit 31C can finely adjust a current to be drawn from the node N72 by adjusting the element values of the respective elements. That is, the bias suppression circuit 31C can finely adjust the base voltage and the base current of the transistor Q73 instead of setting the base voltage and the base current to zero. Thus, the bias suppression circuit 31C can finely adjust the bias current BIAS3 instead of setting the bias current BIAS3 to zero.

When the signal S11 becomes equal to or higher than the base threshold voltage of the transistor Q44 (that is, when the radio frequency input signal RFin becomes equal to or higher than the threshold value), the transistor Q44 is turned on and a potential of the node N42 becomes relatively high. Accordingly, the transistor Q48 is turned on, and a current flows from the collector of the transistor Q48, that is, the connection point Vsink4 (that is, the node N82 (see FIG. 9)) to the emitter thereof. That is, the transistor Q48 draws a current from the node N82.

Accordingly, a voltage of the node N81 (see FIG. 9), that is, a base voltage of the transistor Q83 (see FIG. 9) decreases. In addition, a base current flowing from the node N81 to the transistor Q83 decreases. As a result, the bias current BIAS4 (see FIG. 9) outputted from the emitter of the transistor Q83 is suppressed.

Note that the bias suppression circuit 31C can finely adjust a current to be drawn from the node N82 by adjusting the element values of the respective elements. That is, the bias suppression circuit 31C can finely adjust the base voltage and the base current of the transistor Q83 instead of setting the base voltage and the base current to zero. Thus, the bias suppression circuit 31C can finely adjust the bias current BIAS4 instead of setting the bias current BIAS4 to zero.

On the other hand, when the radio frequency input signal RFin is relatively small, a current between the collector and the emitter of the transistor Q31 becomes relatively small. Thus, a current between the collector and the emitter of the transistor Q32 becomes relatively large. Accordingly, a voltage drop across the resistor R32 becomes relatively large. As a result, a potential of the node N32 becomes relatively low. That is, the signal S11 has a relatively low potential.

When the signal S11 becomes lower than the base threshold voltage of the transistor Q41 (that is, when the radio frequency input signal RFin becomes lower than the threshold voltage), the transistor Q41 is turned off, and a potential of the node N41 becomes relatively low. As a result, the transistor Q43 is turned off, and no current flows from the collector of the transistor Q43, that is, the connection point Vsink1 (that is, the node N12 (see FIG. 9)) to the emitter thereof. That is, the transistor Q43 does not draw a current from the node N12.

When the signal S11 becomes lower than the base threshold voltage of the transistor Q41 (that is, when the radio frequency input signal RFin becomes lower than the threshold voltage), the transistor Q41 is turned off, and a potential of the node N41 becomes relatively low. As a result, the transistor Q46 is turned off, and no current flows from the collector of the transistor Q46, that is, the connection point Vsink2 (that is, the node N62 (see FIG. 9)) to the emitter thereof. That is, the transistor Q46 does not draw a current from the node N62.

When the signal S11 becomes lower than the base threshold voltage of the transistor Q44 (that is, when the radio frequency input signal RFin becomes lower than the threshold value), the transistor Q44 is turned off, and a potential of the node N42 becomes relatively low. Thus, the transistor Q47 is turned off, and no current flows from the collector of the transistor Q47, that is, the connection point Vsink3 (that is, the node N72 (see FIG. 9)) to the emitter thereof. That is, the transistor Q47 does not draw a current from the node N72.

When the signal S11 becomes lower than the base threshold voltage of the transistor Q44 (that is, when the radio frequency input signal RFin becomes lower than the threshold value), the transistor Q44 is turned off, and a potential of the node N42 becomes relatively low. Thus, the transistor Q48 is turned off, and no current flows from the collector of the transistor Q48, that is, the connection point Vsink4 (that is, the node N82 (see FIG. 9)) to the emitter thereof. That is, the transistor Q48 does not draw a current from the node N82.

Effects

In a case where the bias suppression circuit 31C is not provided, when the radio frequency input signal RFin becomes large (for example, an excessive input occurs), that is, when the radio frequency signal RF1 becomes large and a change in load is applied (for example, when a light load is applied) in the power amplifier 1C, a current between the collector and the emitter of each of the transistor Q51 and the transistor Q52 becomes large, which may cause the transistor Q51 and the transistor Q52 to be damaged.

However, the power amplifier 1C includes the bias suppression circuit 31C. Then, the bias suppression circuit 31C suppresses the bias current BIAS1, the bias current BIAS2, the bias current BIAS3, and the bias current BIAS4 when the radio frequency input signal RFin is equal to or higher than the threshold value (for example, when an excessive input occurs).

Accordingly, a current between the collector and the emitter of each of the transistor Q51 and the transistor Q52 is suppressed, and thus, the damage of the transistor Q51 and the transistor Q52 can be suppressed.

When the radio frequency input signal RFin is equal to or higher than the threshold value, the bias suppression circuit 31C draws a current from each of the node N12, the node N62, the node N73, and the node N82. However, the bias suppression circuit 31C can finely adjust the base voltage and the base current of each of the transistor Q13, the transistor Q63, the transistor Q73, and the transistor Q83 instead of setting the base voltage and the base current to zero. That is, the bias suppression circuit 31C can finely adjust the bias current BIAS1, the bias current BIAS2, the bias current BIAS3, and the bias current BIAS4 instead of setting these bias currents to zero. In other words, each of the transistor Q1, the transistor Q2, the transistor Q51, and the transistor Q52 is not turned off but can maintain an on state.

As a result, in the power amplifier 1C, when the radio frequency input signal RFin returns from a value equal to or higher than the threshold value to a value less than the threshold value, the transistor Q1, the transistor Q2, the transistor Q51, and the transistor Q52 can immediately return to the original amplifying operation.

Configuration Examples of Present Disclosure

The present disclosure may have the following configurations.

(1)

A power amplifier comprising: an amplifier circuit including an amplifier transistor including a base electrically connected to an input terminal, the amplifier transistor being configured to amplify a radio frequency input signal to be input to the input terminal; a bias circuit electrically connected to the base of the amplifier transistor, the bias circuit being configured to output a bias current to the base of the amplifier transistor; and a bias suppression circuit electrically connected to the input terminal, the bias suppression circuit being configured to suppress the bias current based on the radio frequency input signal; wherein the bias circuit includes a first transistor including a collector and a base that are electrically connected to a first node to be input with a current, and an emitter electrically connected to a second node, a second transistor including a collector and a base that are electrically connected to the second node, and a third transistor including a base electrically connected to the first node and an emitter, the third transistor being configured to output the bias current from the emitter, and the bias suppression circuit is electrically connected to the second node, and draws a current from the second node of the bias circuit based on the radio frequency input signal.

(2)

The power amplifier according to (1), wherein the bias suppression circuit includes a replica transistor configured to simulate an operation of the amplifier transistor, the replica transistor including a base electrically connected to the input terminal, the base being configured to be input with the radio frequency input signal, and the bias suppression circuit draws a current from the second node of the bias circuit based on a current flowing through the replica transistor.

(3)

The power amplifier according to (1) or (2), wherein the amplifier circuit includes a first circuit electrically connected to the input terminal, the first circuit being configured to amplify the radio frequency input signal and to output a radio frequency signal, and a second circuit electrically connected to the first circuit, the second circuit being configured to amplify the radio frequency signal, the first circuit includes a first amplifier transistor and a second amplifier transistor each of which includes a base electrically connected to the input terminal, the first amplifier transistor and the second amplifier transistor being connected in parallel, the second circuit includes a third amplifier transistor and a fourth amplifier transistor each of which includes a base electrically connected to collectors of the first amplifier transistor and the second amplifier transistor, the third amplifier transistor and the fourth amplifier transistor being connected in parallel, the bias circuit includes a first bias circuit electrically connected to the base of the first amplifier transistor, the first bias circuit being configured to output a first bias current to the base of the first amplifier transistor, a second bias circuit electrically connected to the base of the second amplifier transistor, the second bias circuit being configured to output a second bias current to the base of the second amplifier transistor, a third bias circuit electrically connected to the base of the third amplifier transistor, the third bias circuit being configured to output a third bias current to the base of the third amplifier transistor, and a fourth bias circuit electrically connected to the base of the fourth amplifier transistor, the fourth bias circuit being configured to output a fourth bias current to the base of the fourth amplifier transistor, each of the first bias circuit to the fourth bias circuit includes a first transistor including a collector, a base, and an emitter, the collector and the base being electrically connected to a first node to be input with a current, the emitter being electrically connected to a second node, a second transistor including a collector and a base that are electrically connected to the second node, and a third transistor including a base electrically connected to the first node and an emitter, the third transistor being configured to output the first bias current from the emitter, and the bias suppression circuit is electrically connected to the second node of the first bias circuit and the second node of the second bias circuit, and draws a current from each of the second node of the first bias circuit and the second node of the second bias circuit based on the radio frequency signal.

(4)

The power amplifier according to (1) or (2), wherein the amplifier circuit includes a first circuit electrically connected to the input terminal, the first circuit being configured to amplify the radio frequency input signal and to output a radio frequency signal, and a second circuit electrically connected to the first circuit, the second circuit being configured to amplify the radio frequency signal, the first circuit includes a first amplifier transistor and a second amplifier transistor each of which includes a base electrically connected to the input terminal, the first amplifier transistor and the second amplifier transistor being connected in parallel, the second circuit includes a third amplifier transistor and a fourth amplifier transistor each of which includes a base electrically connected to collectors of the first amplifier transistor and the second amplifier transistor, the third amplifier transistor and the fourth amplifier transistor being connected in parallel, the bias circuit includes a first bias circuit electrically connected to the base of the first amplifier transistor, the first bias circuit being configured to output a first bias current to the base of the first amplifier transistor, a second bias circuit electrically connected to the base of the second amplifier transistor, the second bias circuit being configured to output a second bias current to the base of the second amplifier transistor, a third bias circuit electrically connected to the base of the third amplifier transistor, the third bias circuit being configured to output a third bias current to the base of the third amplifier transistor, and a fourth bias circuit electrically connected to the base of the fourth amplifier transistor, the fourth bias circuit being configured to output a fourth bias current to the base of the fourth amplifier transistor, each of the first bias circuit to the fourth bias circuit includes a first transistor including a collector, a base, and an emitter, the collector and the base being electrically connected to a first node to be input with a current, the emitter being electrically connected to a second node, a second transistor including a collector and a base that are electrically connected to the second node, and a third transistor including a base electrically connected to the first node and an emitter, the third transistor being configured to output the first bias current from the emitter, and the bias suppression circuit is electrically connected to the second node of the third bias circuit and the second node of the fourth bias circuit, and draws a current from each of the second node of the third bias circuit and the second node of the fourth bias circuit based on the radio frequency signal.

(5)

The power amplifier according to (1) or (2), wherein the amplifier circuit includes a first circuit electrically connected to the input terminal, the first circuit being configured to amplify the radio frequency input signal and to output a radio frequency signal, and a second circuit electrically connected to the first circuit, the second circuit being configured to amplify the radio frequency signal, the first circuit includes a first amplifier transistor and a second amplifier transistor each of which includes a base electrically connected to the input terminal, the first amplifier transistor and the second amplifier transistor being connected in parallel, the second circuit includes a third amplifier transistor and a fourth amplifier transistor each of which includes a base electrically connected to collectors of the first amplifier transistor and the second amplifier transistor, the third amplifier transistor and the fourth amplifier transistor being connected in parallel, the bias circuit includes a first bias circuit electrically connected to the base of the first amplifier transistor, the first bias circuit being configured to output a first bias current to the base of the first amplifier transistor, a second bias circuit electrically connected to the base of the second amplifier transistor, the second bias circuit being configured to output a second bias current to the base of the second amplifier transistor, a third bias circuit electrically connected to the base of the third amplifier transistor, the third bias circuit being configured to output a third bias current to the base of the third amplifier transistor, and a fourth bias circuit electrically connected to the base of the fourth amplifier transistor, the fourth bias circuit being configured to output a fourth bias current to the base of the fourth amplifier transistor, each of the first bias circuit to the fourth bias circuit includes a first transistor including a collector, a base, and an emitter, the collector and the base being electrically connected to a first node to be input with a current, the emitter being electrically connected to a second node, a second transistor including a collector and a base electrically connected to the second node, and a third transistor including a base electrically connected to the first node and an emitter, the third transistor being configured to output the first bias current from the emitter, and the bias suppression circuit is electrically connected to the second node of the first bias circuit, the second node of the second bias circuit, the second node of the third bias circuit, and the second node of the fourth bias circuit, and draws a current from each of the second node of the first bias circuit, the second node of the second bias circuit, the second node of the third bias circuit, and the second node of the fourth bias circuit based on the radio frequency signal.

(6)

The power amplifier according to any one of (3) to (5), wherein a first output power operation mode in which amplification is performed at a relatively high first output power, and a second output power operation mode in which amplification is performed at a relatively low second output power are provided, the first bias circuit outputs the first bias current to the first amplifier transistor in the first output power operation mode, the second bias circuit outputs the second bias current to the second amplifier transistor in both the first output power operation mode and the second output power operation mode, the third bias circuit outputs the third bias current to the third amplifier transistor in the first output power operation mode, and the fourth bias circuit outputs the fourth bias current to the fourth amplifier transistor in both the first output power operation mode and the second output power operation mode.

It should be noted that the above-described embodiments are intended to facilitate understanding of the present disclosure, and are not intended to limit the interpretation of the present disclosure. The present disclosure may be modified or improved without departing from the gist thereof, and equivalents thereof are also included in the present disclosure.

What is claimed is:

1. A power amplifier comprising:

an amplifier circuit comprising an amplifier transistor, the amplifier transistor having a base electrically connected to an input terminal and being configured to amplify a radio frequency input signal input to the input terminal;

a bias circuit electrically connected to the base of the amplifier transistor, the bias circuit being configured to output a bias current to the base of the amplifier transistor; and a bias suppression circuit electrically connected to the input terminal, the bias suppression circuit being configured to suppress the bias current based on the radio frequency input signal;

wherein the bias circuit comprises:

a first transistor having a collector and a base that are electrically connected to a first node, and an emitter electrically connected to a second node, the first node being input with a current;

a second transistor having a collector and a base that are electrically connected to the second node; and a third transistor having an emitter and a base electrically connected to the first node, the third transistor being configured to output the bias current from the emitter, wherein the bias suppression circuit is electrically connected to the second node, and is configured to draw a current from the second node of the bias circuit based on the radio frequency input signal, wherein the bias suppression circuit comprises a replica transistor configured to simulate an operation of the amplifier transistor, the replica transistor having a base electrically connected to the input terminal, the base being input with the radio frequency input signal, and wherein the bias suppression circuit is configured to draw a current from the second node of the bias circuit based on a current flowing through the replica transistor.

2. The power amplifier according to claim 1, wherein the amplifier circuit further comprises:

a first circuit electrically connected to the input terminal, the first circuit being configured to amplify the radio frequency input signal and to output a radio frequency signal; and a second circuit electrically connected to the first circuit, the second circuit being configured to amplify the radio frequency signal, wherein the first circuit comprises a first amplifier transistor and a second amplifier transistor each having a base electrically connected to the input terminal, the first amplifier transistor and the second amplifier transistor being connected in parallel, wherein the second circuit comprises a third amplifier transistor and a fourth amplifier transistor each having a base electrically connected to collectors of the first amplifier transistor and the second amplifier transistor, the third amplifier transistor and the fourth amplifier transistor being connected in parallel, wherein the bias circuit comprises:

a first bias circuit electrically connected to the base of the first amplifier transistor, the first bias circuit being configured to output a first bias current to the base of the first amplifier transistor;

a second bias circuit electrically connected to the base of the second amplifier transistor, the second bias circuit being configured to output a second bias current to the base of the second amplifier transistor;

a third bias circuit electrically connected to the base of the third amplifier transistor, the third bias circuit being configured to output a third bias current to the base of the third amplifier transistor; and a fourth bias circuit electrically connected to the base of the fourth amplifier transistor, the fourth bias circuit being configured to output a fourth bias current to the base of the fourth amplifier transistor, wherein each of the first, second, third, and fourth bias circuits comprises:

a first transistor having a collector, a base, and an emitter, the collector and the base being electrically connected to a first node input with a current, the emitter being electrically connected to a second node;

a second transistor having a collector and a base that are electrically connected to the second node; and a third transistor having a base electrically connected to the first node and an emitter, the third transistor being configured to output the first bias current from the emitter, and wherein the bias suppression circuit is electrically connected to the second node of the first bias circuit and to the second node of the second bias circuit, and is configured to draw a current from each of the second node of the first bias circuit and the second node of the second bias circuit, based on the radio frequency signal.

3. The power amplifier according to claim 1, wherein the amplifier circuit further comprises:

a first circuit electrically connected to the input terminal, the first circuit being configured to amplify the radio frequency input signal and to output a radio frequency signal; and a second circuit electrically connected to the first circuit, the second circuit being configured to amplify the radio frequency signal, wherein the first circuit comprises a first amplifier transistor and a second amplifier transistor each having a base electrically connected to the input terminal, the first amplifier transistor and the second amplifier transistor being connected in parallel, wherein the second circuit comprises a third amplifier transistor and a fourth amplifier transistor each having a base electrically connected to collectors of the first amplifier transistor and the second amplifier transistor, the third amplifier transistor and the fourth amplifier transistor being connected in parallel, wherein the bias circuit comprises:

a first bias circuit electrically connected to the base of the first amplifier transistor, the first bias circuit being configured to output a first bias current to the base of the first amplifier transistor;

a second bias circuit electrically connected to the base of the second amplifier transistor, the second bias circuit being configured to output a second bias current to the base of the second amplifier transistor;

a third bias circuit electrically connected to the base of the third amplifier transistor, the third bias circuit being configured to output a third bias current to the base of the third amplifier transistor; and a fourth bias circuit electrically connected to the base of the fourth amplifier transistor, the fourth bias circuit being configured to output a fourth bias current to the base of the fourth amplifier transistor, wherein each of the first, second, third, and fourth bias circuits comprises:

a first transistor having a collector, a base, and an emitter, the collector and the base being electrically connected to a first node input with a current, the emitter being electrically connected to a second node;

a second transistor having a collector and a base that are electrically connected to the second node; and a third transistor having a base electrically connected to the first node and an emitter, the third transistor being configured to output the first bias current from the emitter, and wherein the bias suppression circuit is electrically connected to the second node of the third bias circuit and to the second node of the fourth bias circuit, and is configured to draw a current from each of the second node of the third bias circuit and the second node of the fourth bias circuit, based on the radio frequency signal.

4. The power amplifier according to claim 1, wherein the amplifier circuit further comprises:

a first circuit electrically connected to the input terminal, the first circuit being configured to amplify the radio frequency input signal and to output a radio frequency signal; and a second circuit electrically connected to the first circuit, the second circuit being configured to amplify the radio frequency signal, wherein the first circuit comprises a first amplifier transistor and a second amplifier transistor each having a base electrically connected to the input terminal, the first amplifier transistor and the second amplifier transistor being connected in parallel, the second circuit comprises a third amplifier transistor and a fourth amplifier transistor each having a base electrically connected to collectors of the first amplifier transistor and the second amplifier transistor, the third amplifier transistor and the fourth amplifier transistor being connected in parallel, wherein the bias circuit comprises:

a first bias circuit electrically connected to the base of the first amplifier transistor, the first bias circuit being configured to output a first bias current to the base of the first amplifier transistor;

a second bias circuit electrically connected to the base of the second amplifier transistor, the second bias circuit being configured to output a second bias current to the base of the second amplifier transistor;

a third bias circuit electrically connected to the base of the third amplifier transistor, the third bias circuit being configured to output a third bias current to the base of the third amplifier transistor; and a fourth bias circuit electrically connected to the base of the fourth amplifier transistor, the fourth bias circuit being configured to output a fourth bias current to the base of the fourth amplifier transistor, wherein each of the first, second, third, and fourth bias circuits comprises:

a first transistor having a collector, a base, and an emitter, the collector and the base being electrically connected to a first node input with a current, the emitter being electrically connected to a second node;

a second transistor having a collector and a base electrically connected to the second node; and a third transistor having a base electrically connected to the first node and an emitter, the third transistor being configured to output the first bias current from the emitter, and wherein the bias suppression circuit is electrically connected to the second node of the first bias circuit, to the second node of the second bias circuit, to the second node of the third bias circuit, and to the second node of the fourth bias circuit, and is configured to draw a current from each of the second node of the first bias circuit, from the second node of the second bias circuit, from the second node of the third bias circuit, and from the second node of the fourth bias circuit based on the radio frequency signal.

5. The power amplifier according to claim 2, wherein the power amplifier is configured to operate in a first output power operation mode in which amplification is performed at a relatively high first output power, and is configured to operate in a second output power operation mode in which amplification is performed at a relatively low second output power, wherein the first bias circuit is configured to output the first bias current to the first amplifier transistor in the first output power operation mode, wherein the second bias circuit is configured to output the second bias current to the second amplifier transistor in both the first output power operation mode and the second output power operation mode, wherein the third bias circuit is configured to output the third bias current to the third amplifier transistor in the first output power operation mode, and wherein the fourth bias circuit is configured to output the fourth bias current to the fourth amplifier transistor in both the first output power operation mode and the second output power operation mode.

* * * * *